(12) United States Patent
Adkisson et al.

(10) Patent No.: US 9,029,229 B2
(45) Date of Patent: May 12, 2015

(54) SEMICONDUCTOR DEVICE AND METHOD OF FORMING THE DEVICE BY FORMING MONOCRYSTALLINE SEMICONDUCTOR LAYERS ON A DIELECTRIC LAYER OVER ISOLATION REGIONS

(71) Applicant: International Business Machines Corporation, Armonk, NY (US)

(72) Inventors: James W. Adkisson, Jericho, VT (US); Peng Cheng, Essex Junction, VT (US); Vibhor Jain, Essex Junction, VT (US); Vikas Kumar Kaushal, Essex Junction, VT (US); Qizhi Liu, Lexington, MA (US); John J. Pekarik, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 13/904,304

(22) Filed: May 29, 2013

(65) Prior Publication Data

US 2014/0353725 A1    Dec. 4, 2014

(51) Int. Cl.
*H01L 29/737*    (2006.01)
*H01L 29/66*    (2006.01)

(52) U.S. Cl.
CPC ........ *H01L 29/737* (2013.01); *H01L 29/66242* (2013.01)

(58) Field of Classification Search
CPC ................... H01L 29/66234–29/66348; H01L 29/737–29/7378
USPC .................. 438/312–321, 411, 412, 421, 422
See application file for complete search history.

(56) References Cited

U.S. PATENT DOCUMENTS

| 5,242,854 | A | 9/1993 | Solheim et al. |
| 5,494,837 | A | 2/1996 | Subramanian et al. |
| 6,809,024 | B1 | 10/2004 | Dunn et al. |
| 6,888,221 | B1 | 5/2005 | Joseph et al. |

(Continued)

FOREIGN PATENT DOCUMENTS

FR    2 868 206 A1    3/2004

OTHER PUBLICATIONS

U.S. Appl. No. 13/705,717, filed Dec. 5, 2012.

*Primary Examiner* — Steven J Fulk
*Assistant Examiner* — Eric Ward
(74) *Attorney, Agent, or Firm* — Gibb & Riley, LLC; Michael J. LeStrange, Esq.

(57) ABSTRACT

Disclosed are devices and methods of forming the devices wherein pair(s) of first openings are formed through a dielectric layer and a first semiconductor layer into a substrate and, within the substrate, the first openings of each pair are expanded laterally and merged to form a corresponding trench. Dielectric material is deposited, filling the upper portions of the first openings and creating trench isolation region(s). A second semiconductor layer is deposited and second opening(s) are formed through the second semiconductor and dielectric layers, exposing monocrystalline portion(s) of the first semiconductor layer between the each pair of first openings. A third semiconductor layer is epitaxially deposited with a polycrystalline section on the second semiconductor layer and monocrystalline section(s) on the exposed monocrystalline portion(s) of the first semiconductor layer. A crystallization anneal is performed and a device (e.g., a bipolar device) is formed incorporating the resulting monocrystalline second and third semiconductor layers.

13 Claims, 17 Drawing Sheets

(56) References Cited

U.S. PATENT DOCUMENTS

| | | |
|---|---|---|
| 6,972,443 B2 | 12/2005 | Khater |
| 7,037,798 B2 | 5/2006 | Adam et al. |
| 7,342,293 B2 * | 3/2008 | Wallner et al. ................. 257/565 |
| 7,521,772 B2 | 4/2009 | Adam et al. |
| 7,838,374 B2 * | 11/2010 | Van Noort et al. ............ 438/318 |
| 7,888,745 B2 * | 2/2011 | Khater et al. ................. 257/370 |
| 7,923,754 B2 | 4/2011 | Miyamoto et al. |
| 8,796,149 B1 * | 8/2014 | Adkisson et al. ............. 438/700 |
| 2004/0224461 A1 | 11/2004 | Dunn et al. |
| 2008/0121937 A1 | 5/2008 | Adam et al. |
| 2009/0179228 A1 | 7/2009 | Joseph et al. |
| 2014/0117493 A1 * | 5/2014 | Cheng et al. ................... 257/526 |
| 2014/0151852 A1 * | 6/2014 | Adkisson et al. ............. 257/565 |
| 2014/0217551 A1 * | 8/2014 | Dunn et al. .................... 257/565 |
| 2014/0284758 A1 * | 9/2014 | Harame et al. ................ 257/499 |
| 2014/0327106 A1 * | 11/2014 | Liu ................................ 257/526 |
| 2014/0327111 A1 * | 11/2014 | Camillo-Castillo et al. .. 257/586 |
| 2014/0353725 A1 * | 12/2014 | Adkisson et al. ............. 257/197 |

* cited by examiner

SEMICONDUCTOR DEVICE AND METHOD OF FORMING THE DEVICE BY FORMING MONOCRYSTALLINE SEMICONDUCTOR LAYERS ON A DIELECTRIC LAYER OVER ISOLATION REGIONS

BACKGROUND

The structures and method disclosed herein relate to semiconductor devices (e.g., bipolar devices, such as bipolar junction transistors (BJTs) or heterojunction bipolar transistors (HBTs)) and a method of forming such devices that includes forming a monocrystalline semiconductor layer (e.g., a monocrystalline extrinsic base layer) over isolation region(s).

As discussed in U.S. Pat. No. 6,972,443 issued on Dec. 6, 2005 to Khater, assigned to International Business Machines Corporation and incorporated herein by reference, it is desirable in bipolar devices, such as bipolar junction transistors (BJTs) and, particularly, in high performance heterojunction bipolar transistors (HBTs), to have a relatively high transit frequency $f_T$ and maximum oscillation frequency $f_{max}$. $f_{max}$ is a function of $f_T$ as well as various parasitic resistances and capacitances including, but are not limited to, parasitic base resistance $R_b$ and parasitic collector-to-base capacitance $C_{cb}$. Reduction of the parasitic resistances and capacitances can result in a higher $f_{max}$. Thus, it would be advantageous to provide an improved bipolar device, such as a bipolar junction transistor (BJT) or heterojunction bipolar transistor (HBT), with both reduced base resistance $R_b$ and reduced collector-to-base capacitance $C_{cb}$ and a method of forming such an improved bipolar device.

SUMMARY

Disclosed herein are semiconductor devices and methods of forming such devices that include forming semiconductor layers (e.g., monocrystalline semiconductor layers) on a dielectric layer over one or more trench isolation region(s). In the methods, pair(s) of first openings can be formed through a dielectric layer and a first semiconductor layer into a semiconductor substrate and, within the substrate, the first openings of the pair(s) can be expanded laterally and merged to form trench(es). Dielectric material can then be deposited to fill the upper portions of the first openings, thereby forming trench isolation region(s). An second, amorphous or polycrystalline, semiconductor layer can be deposited on the dielectric layer and second opening(s) can be formed through the second semiconductor layer and dielectric layer to monocrystalline portion(s) of the first semiconductor layer between the first openings of each of the pair(s). A third semiconductor layer can be epitaxially deposited so as to have a polycrystalline section on the second semiconductor layer and monocrystalline section(s) on the monocrystalline portion(s) of the first semiconductor layer within the second opening(s). A solid phase epitaxy regrowth process can be used to crystallize semiconductor material adjacent to the monocrystalline section(s) of the third semiconductor layer. Then, a semiconductor device can be formed that incorporates the resulting monocrystalline second and third semiconductor layers. For example, a bipolar device, such as a bipolar junction transistor (BJT) or heterojunction bipolar transistor (HBT), can be formed that incorporates these layers as extrinsic base layers. In the case of a bipolar device, the monocrystalline extrinsic base layers provide reduced base resistance $R_b$ and the isolation regions below provide reduced collector-to-base capacitance $C_{cb}$.

Generally, disclosed herein is a method of forming semiconductor layers (e.g., monocrystalline semiconductor layers) on a dielectric layer over at least one trench isolation region. In this method, a semiconductor substrate and, particularly, a monocrystalline semiconductor substrate can be provided. Additionally, a first semiconductor layer can be formed (e.g., epitaxially deposited) on the semiconductor substrate such that it too is monocrystalline. Then, a dielectric layer can be formed on the first semiconductor layer and a sacrificial layer can be formed on the dielectric layer.

Next, a pair of first openings can be formed. Specifically, the pair of first openings can be formed (i.e., patterned and etched) such that the first openings are in parallel and such that they each extend vertically through the sacrificial layer, the dielectric layer, the first semiconductor layer and into the semiconductor substrate.

Once the pair of first openings is formed, an etch process can be performed in order to laterally expand and merge the lower portions of the first openings within the semiconductor substrate only, thereby creating a trench. Dielectric material can be deposited on the sacrificial layer in order to fill at least the upper portions of the first openings above the trench, thereby creating a trench isolation region.

After the trench isolation region is formed, the sacrificial layer can be removed and a second semiconductor layer (e.g., an amorphous or polycrystalline semiconductor seed layer) can be formed on the dielectric layer. Then, a second opening can be formed. Specifically, the second opening can be formed (i.e., patterned and etched) such that it extends vertically through the second semiconductor layer and dielectric layer to expose a monocrystalline portion of the first semiconductor layer between the upper portions of the first openings.

Next, a third semiconductor layer can be epitaxially deposited on the second semiconductor layer and on the monocrystalline portion of the first semiconductor layer in the second opening. As a result of the epitaxial deposition process, the third semiconductor layer will have a polycrystalline section on the second semiconductor layer and a monocrystalline section on the monocrystalline portion of the first semiconductor layer in the second opening.

Once the third semiconductor layer is epitaxially deposited, an anneal process and, particularly, a solid phase epitaxy regrowth process can be performed. This solid phase epitaxy regrowth process can crystallize regions of both the second semiconductor layer and the polycrystalline section of the third semiconductor layer adjacent to the monocrystalline section of the third semiconductor layer.

Subsequently, additional processing steps can be performed in order to incorporate the monocrystalline semiconductor layers into a semiconductor device (e.g., into a bipolar device or any other semiconductor device).

Also disclosed herein is a method of forming a bipolar device (e.g., a bipolar junction transistor (BJT) or heterojunction bipolar transistor (HBT)) having extrinsic base layers (e.g., monocrystalline extrinsic base layers) on a dielectric layer over trench isolation regions. In this method, a semiconductor substrate and, particularly, a monocrystalline semiconductor substrate can be provided. A collector region can be formed within the semiconductor substrate. Additionally, a first semiconductor layer and, particularly, an intrinsic base layer can be formed (e.g., epitaxially deposited) on the semiconductor substrate such that it too is monocrystalline. Then, a dielectric layer can be formed on the intrinsic base layer and a sacrificial layer can be formed on the dielectric layer.

Next, at least two pairs of first openings can be formed. These pairs of first openings can be formed (i.e., patterned and etched) such that the first openings in each pair are arranged in parallel and extend vertically through the sacrificial layer, the dielectric layer, the intrinsic base layer and into the semiconductor substrate. One pair of first openings can be patterned so as to extend into the semiconductor substrate on one side of the collector region and another pair of first openings can be patterned so as to extend into the semiconductor substrate on the opposite side of the collector region.

Once the pairs of first openings are formed, an etch process can be performed in order to laterally expand and merge the lower portions of the first openings in each of the pairs within the semiconductor substrate only, thereby creating trenches on opposing sides of the collector region. Dielectric material can then be deposited on the sacrificial layer in order to fill at least the upper portions of the first openings above the trenches, thereby creating trench isolation regions on opposing sides of the collector region.

After the trench isolation regions are formed, the sacrificial layer can be removed and a first extrinsic base layer (e.g., a amorphous or polycrystalline extrinsic base seed layer) can be formed on the dielectric layer. Then, second openings can be formed. Specifically, the second openings can be formed (i.e., patterned and etched) such that they extend vertically through the first extrinsic base layer and the dielectric layer to expose monocrystalline portions of the intrinsic base layer between the first openings in each of the pairs.

Next, a second extrinsic base layer can be epitaxially deposited on the first extrinsic base layer and on the monocrystalline portions of the intrinsic base layer in the second openings. As a result of the epitaxial deposition process, the second extrinsic base layer will have a polycrystalline section on the first extrinsic base layer and monocrystalline sections on the monocrystalline portions of the intrinsic base layer in the second openings.

Once the second extrinsic base layer is epitaxially deposited, an anneal process and, particularly, a solid phase epitaxy regrowth process can be performed. This solid phase epitaxy regrowth process can crystallize regions of both the first extrinsic base layer and the polycrystalline section of the second extrinsic base layer adjacent to the monocrystalline sections of the second extrinsic base layer such that monocrystalline extrinsic base material is positioned on the dielectric layer above the trench isolation regions and the collector region.

Subsequently, additional processing steps can be performed in order to complete the bipolar device. For example, a third opening can be formed such that it is aligned above the collector region and such that it extends vertically through the second extrinsic base layer and first extrinsic base layer to the dielectric layer, thereby exposing aligned vertical sidewalls of the first and second extrinsic base layers. This third opening can further be extended using a wet etch process such that a lower portion of the third opening exposes the top surface of the intrinsic base layer and also undercuts the first extrinsic base layer so as to expose a bottom surface of the first extrinsic base layer. Next, a selective epitaxial deposition process can be performed in order to form an additional semiconductor layer within the third opening on the exposed monocrystalline surfaces of the intrinsic base layer and the first and second extrinsic base layers. This additional semiconductor layer can fill the lower portion of the third opening such that an edge portion of the additional semiconductor layer is stacked vertically between the top surface of the intrinsic base layer and the bottom surface of the first extrinsic base layer. This additional semiconductor layer can further have a vertical extension positioned laterally adjacent to the aligned vertical sidewalls of the first and second extrinsic base layers above the lower portion of the third opening. As a result of the selective epitaxial deposition process, the edge portion and the vertical extension of the additional semiconductor layer can create an entirely monocrystalline link-up region between the intrinsic base layer and the first and second extrinsic base layers. Following additional semiconductor layer formation, dielectric spacers and an emitter layer can be formed on the additional semiconductor layer within the third opening such that the emitter layer is electrically isolated from the extrinsic base layers by the dielectric spacers.

Also disclosed herein is a bipolar device (e.g., a bipolar junction transistor (BJT) or a heterojunction bipolar transistor (HBT)) formed, according to the method described above. Such a bipolar device can comprise a semiconductor substrate and, particularly, a monocrystalline semiconductor substrate. This semiconductor substrate can comprise trench isolation regions and a collector region positioned laterally between the trench isolation regions.

An intrinsic base layer can be positioned on the top surface of the semiconductor substrate above the collector region and can further extend laterally onto the trench isolation regions. This intrinsic base layer can be monocrystalline. A dielectric layer can be positioned on the top surface of the intrinsic base layer. Pairs of first openings can extend vertically through the dielectric layer and the intrinsic base layer. Each pair of first openings can be aligned above a corresponding trench isolation region and can be filled with dielectric material.

A first extrinsic base layer (e.g., an extrinsic base seed layer) can be on the dielectric layer and can extend laterally over the dielectric material that fills the first openings of each of the pairs. Second openings can extend vertically through the first extrinsic base layer and dielectric layer to monocrystalline portions of the intrinsic base layer between the first openings of each of the pairs.

A second extrinsic base layer can be positioned on the top surface of the first extrinsic base layer and on the monocrystalline portions of the intrinsic base layer within the second openings. The first and second extrinsic base layers can be monocrystalline. A third opening can be aligned above the collector region (i.e., between the trench isolation regions) and can extend vertically through the second extrinsic base layer, first extrinsic base layer and the dielectric layer. Additionally, the lower portion of this third opening within the dielectric layer can undercut the first extrinsic base layer. Thus, during formation of the third opening, monocrystalline surfaces of the intrinsic base layer, the first extrinsic base layer and the second extrinsic base layer are exposed. These monocrystalline surfaces include the top surface of the intrinsic base layer and the bottom surface of the first extrinsic base layer within the lower portion of the third opening and the aligned vertical surfaces of the first and second extrinsic base layers in the upper portion of the third opening above the lower portion.

An additional semiconductor layer can fill the lower portion of the third opening such that an edge portion of the additional semiconductor layer is stacked vertically between a top surface of the intrinsic base layer and a bottom surface of the first extrinsic base layer. The additional semiconductor layer can further have a vertical extension positioned laterally adjacent to the aligned vertical sidewalls of the first and second extrinsic base layers above the lower portion of the third opening. As a result of a selective epitaxial deposition process used to form this additional semiconductor layer on the exposed monocrystalline surfaces within the third opening, the edge portion and the vertical extension of the additional semiconductor layer create an entirely monocrystalline link-up region between the intrinsic base layer and the first and second extrinsic base layers.

An emitter layer and dielectric spacers can be positioned within the third opening on the additional semiconductor layer such that the emitter layer is electrically isolated from the first and second extrinsic base layer by the dielectric spacers.

BRIEF DESCRIPTION OF THE DRAWINGS

The structures and method disclosed herein will be better understood from the following detailed description with reference to the drawings, which are not necessarily drawn to scale and in which.

DETAILED DESCRIPTION

Figure 1:
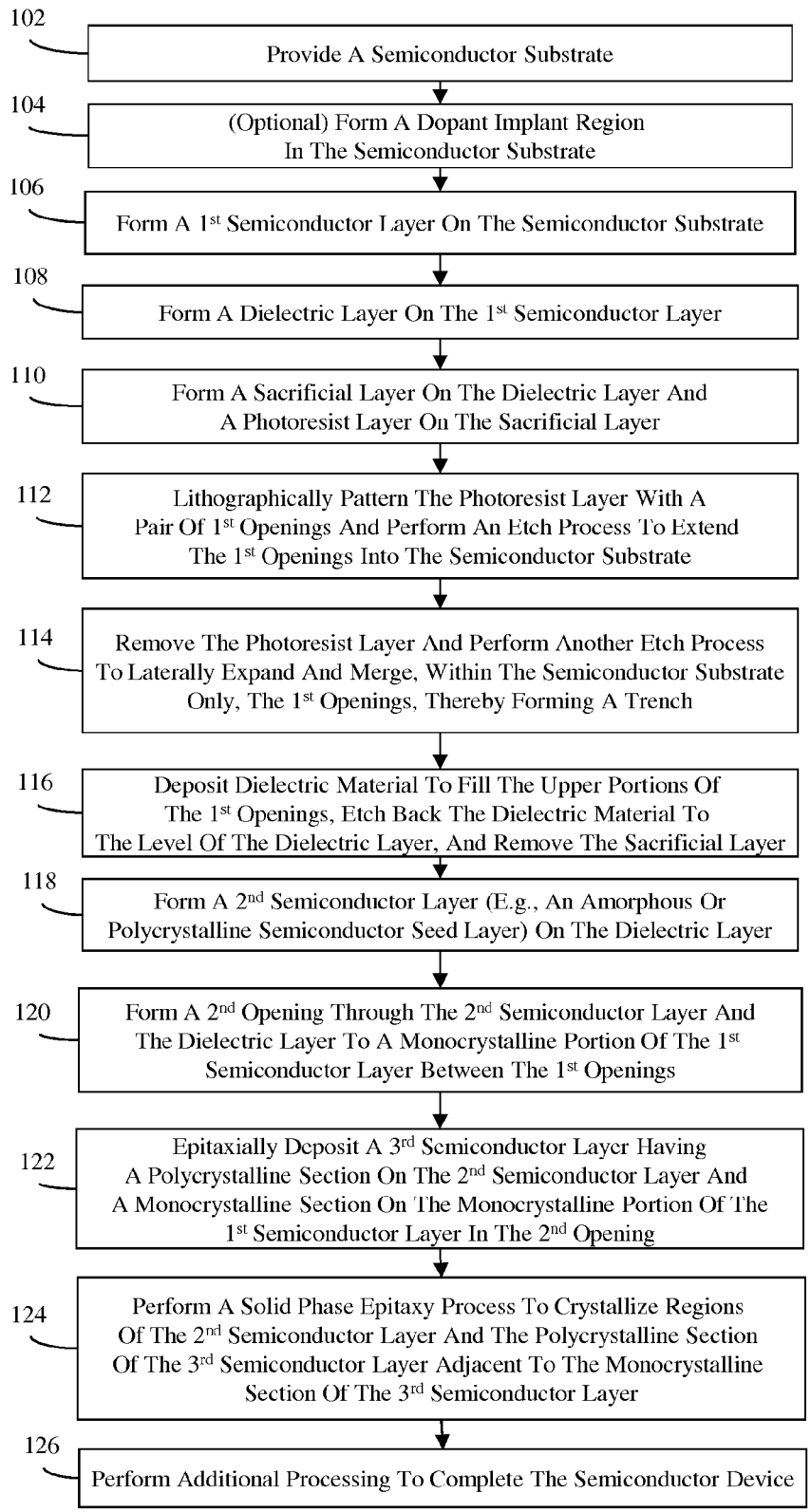
FIG. 1 is a flow diagram of a method of forming semiconductor layers on a dielectric layer over one or more trench isolation regions.

As mentioned above, it is desirable in bipolar devices, such as bipolar junction transistors (BJTs) and, particularly, in high performance heterojunction bipolar transistors (HBTs), to have a relatively high transit frequency $f_T$ and maximum oscillation frequency $f_{max}$. $f_{max}$ is a function of $f_T$ as well as various parasitic resistances and capacitances including, but are not limited to, parasitic base resistance $R_b$ and parasitic collector-to-base capacitance $C_{cb}$. Reduction of the parasitic resistances and capacitances can result in a higher $f_{max}$. Typically, semiconductor material for an extrinsic base layer is epitaxially grown above an isolation region (e.g., directly on a trench isolation region or on a dielectric layer above a trench isolation region) such that the extrinsic base layer is polycrystalline. However, those skilled in the art will recognize that a monocrystalline extrinsic base layer would provide reduced base resistance. Unfortunately, current techniques for forming a monocrystalline semiconductor layer, such as a monocrystalline extrinsic base layer, above isolation material are not particularly efficient.

In view of the foregoing, disclosed herein are semiconductor devices and methods of forming such devices that include forming semiconductor layers (e.g., monocrystalline semiconductor layers) on a dielectric layer over one or more trench isolation region(s). In the methods, pair(s) of first openings can be formed through a dielectric layer and a first semiconductor layer into a semiconductor substrate and, within the substrate, the first openings of the pair(s) can be expanded laterally and merged to form trench(es). Dielectric material can then be deposited to fill the upper portions of the first openings, thereby forming trench isolation region(s). An second, amorphous or polycrystalline, semiconductor layer can be deposited on the dielectric layer and second opening(s) can be formed through the second semiconductor layer and dielectric layer to monocrystalline portion(s) of the first semiconductor layer between the first openings of each of the pair(s). A third semiconductor layer can be epitaxially deposited so as to have a polycrystalline section on the second semiconductor layer and monocrystalline section(s) on the monocrystalline portion(s) of the first semiconductor layer within the second opening(s). A solid phase epitaxy regrowth process can be used to crystallize semiconductor material adjacent to the monocrystalline section(s) of the third semiconductor layer. Then, a semiconductor device can be formed that incorporates the resulting monocrystalline second and third semiconductor layers. For example, a bipolar device, such as a bipolar junction transistor (BJT) or heterojunction bipolar transistor (HBT), can be formed that incorporates these layers as extrinsic base layers. In the case of a bipolar device, the monocrystalline extrinsic base layers provide reduced base resistance $R_b$ and the isolation regions below provide reduced collector-to-base capacitance $C_{cb}$.

Referring to the flow diagram of FIG. 1, generally, disclosed herein is a method of forming, for incorporation into a semiconductor device (e.g., a bipolar device, a capacitor, etc.) semiconductor layers (e.g., monocrystalline semiconductor layers) on a dielectric layer over one or more trench isolation regions. In this method, a semiconductor substrate 201 and, particularly, a monocrystalline semiconductor substrate can be provided (102, see FIG. 2). The semiconductor substrate 201 can comprise a monocrystalline semiconductor material. For example, the semiconductor substrate 201 can comprise a bulk silicon substrate or any other suitable bulk monocrystalline semiconductor substrate. Alternatively, the semiconductor substrate 201 can comprise a monocrystalline semiconductor layer of a semiconductor-on-insulator (SOI) wafer (e.g., a silicon layer of a silicon-on-insulator (SOI) wafer) (not shown). The semiconductor substrate 201 can have a first type conductivity (e.g., a P-type conductivity). Thus, for example, the semiconductor substrate 201 can comprise a P−silicon substrate (i.e., a silicon substrate having a relatively low concentration of a P-type dopant).

Figure 2:
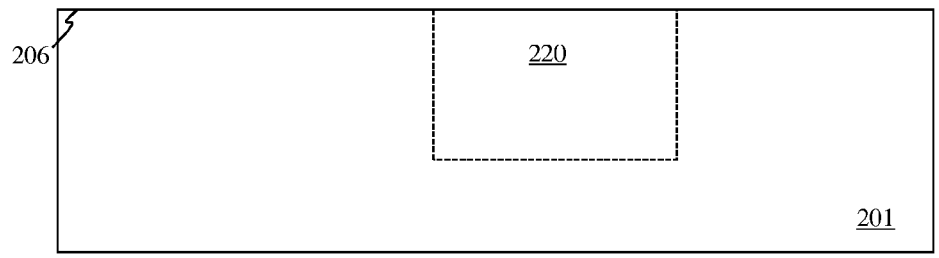
FIG. 2 is a cross-section diagram of a partially completed structure formed according to the flow diagram of FIG. 1 or FIG. 17.

Optionally, depending upon the type of semiconductor device being formed, a dopant implantation process can be performed in order to form one or more dopant implant regions (e.g., see dopant implant region 220) as semiconductor device component(s) within the semiconductor substrate 201 (104, see FIG. 2). For example, for a bipolar device, as discussed in greater detail below, this dopant implant region 220 can comprise a collector region at the top surface 206 of the semiconductor substrate 201; for a capacitor, this dopant implant region 220 can comprise a buried capacitor plate; and so on.

Figure 3:
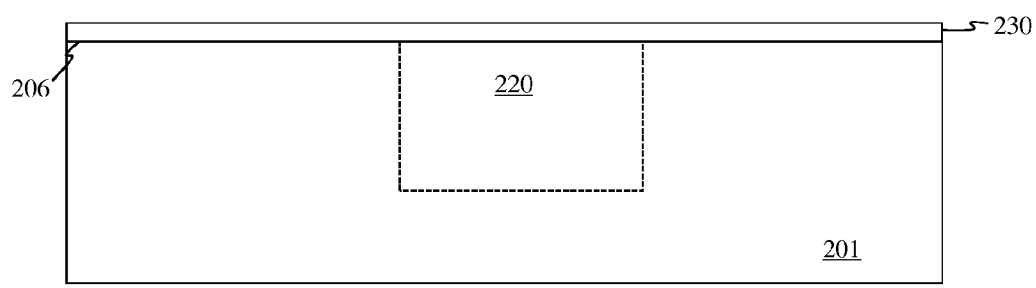
FIG. 3 is a cross-section diagram of a partially completed structure formed according to the flow diagram of FIG. 1 or FIG. 17.

Next, a first semiconductor layer 230 can be formed on the top surface 206 of the monocrystalline semiconductor substrate 201 (106, see FIG. 3). This first semiconductor layer 230 can be formed at process 106 such that it comprises either the same semiconductor material or a different semiconductor material than the semiconductor substrate 201. For example, the first semiconductor layer 230 can comprise a silicon layer, a silicon germanium layer, a silicon carbide layer, a silicon germanium carbide layer or any other suitable semiconductor layer. This first semiconductor layer 230 can be formed at process 106 using, for example, a non-selective epitaxial deposition process (e.g., a non-selective, ultra high-vacuum-chemical vapor deposition (UHV-CVD), low-temperature epitaxy (LTE) process) such that the crystalline structure of the first semiconductor layer 230 will mimic that of the monocrystalline semiconductor substrate 201 below (i.e., such that the first semiconductor layer 230 will be a monocrystalline semiconductor layer). Epitaxial deposition of the first semiconductor layer 230 can proceed at process 106 without any doping to alter conductivity type. Alternatively, the first semiconductor layer 230 may be in-situ doped or subsequently implanted so as to have the first type conductivity or the second type conductivity, depending upon the type of semiconductor device being formed.

Figure 4:
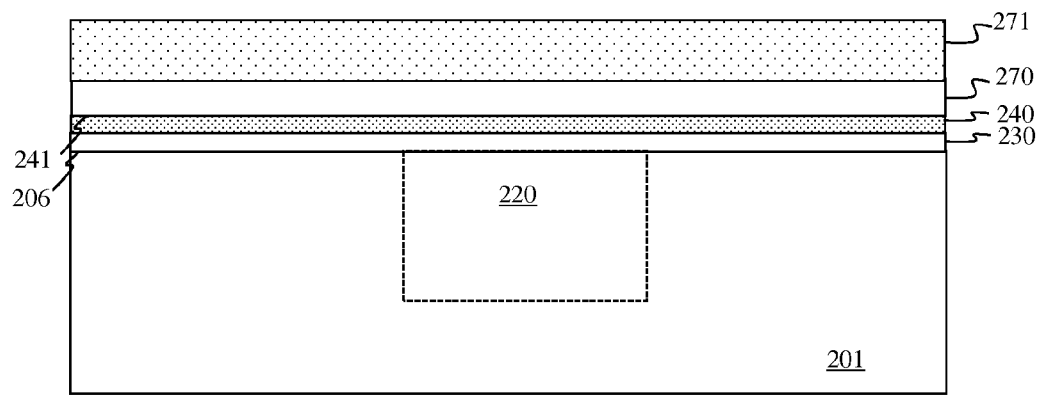
FIG. 4 is a cross-section diagram of a partially completed structure formed according to the flow diagram of FIG. 1 or FIG. 17.

After the first semiconductor layer 230 is formed at process 106, one or more dielectric layer(s) 240 can be formed (e.g., deposited) on the first semiconductor layer 230 (108, see FIG. 4). The dielectric layer(s) 240 can comprise, for example, a silicon oxide layer, a silicon nitride layer, a silicon oxynitride layer or any other suitable dielectric layer or stack of such dielectric layers. Next, a sacrificial layer 270 (e.g., a silicon layer, a silicon germanium layer, a germanium layer, or a silicon nitride layer) can be formed (e.g., deposited) on the dielectric layer(s) 240 and a photoresist layer 271 can be formed (e.g., deposited) on the sacrificial layer 270 (110, see FIG. 4).

Figure 5:
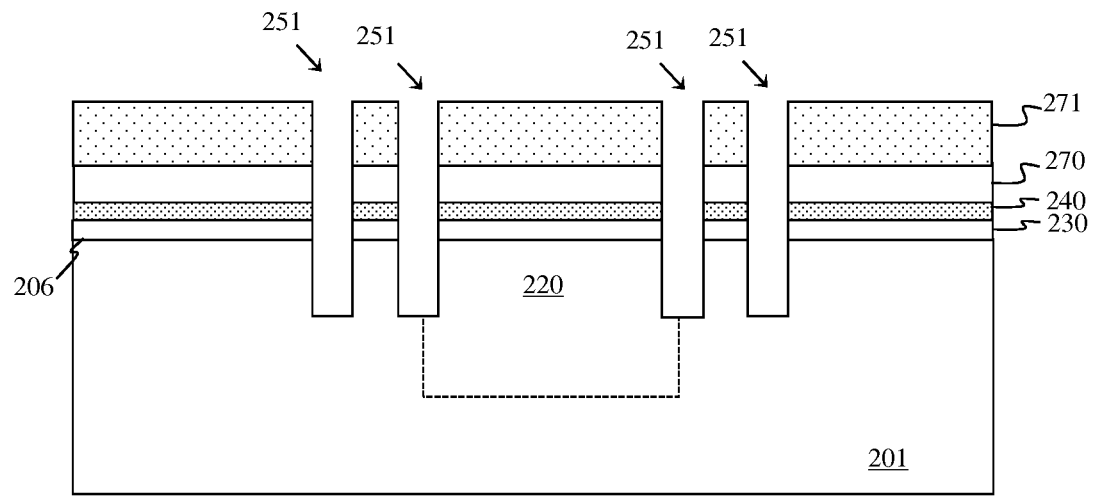
FIG. 5 is a cross-section diagram of a partially completed structure formed according to the flow diagram of FIG. 1 or FIG. 17.
Figure 6:
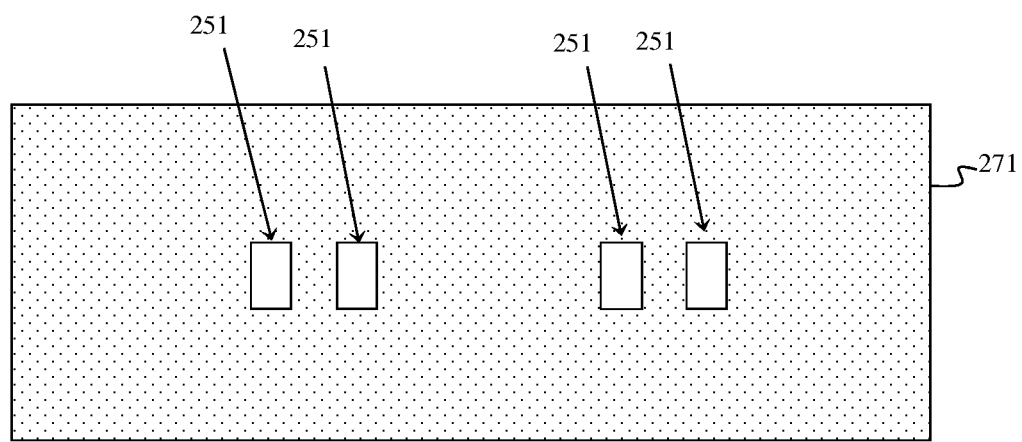
FIG. 6 is a top view diagram of the partially completed structure of FIG. 5.

At least one pair of first openings 251 can be lithographically patterned into the photoresist layer 271 and a non-selective, anisotropic (i.e., directional), etch process can be formed so that the first openings 251 in each pair extend vertically through the sacrificial layer 270, dielectric layer(s) 240, first semiconductor layer 230 and into the semiconductor substrate 201 below (112, see FIG. 5). As shown in the top view diagram of FIG. 6, these first openings 251 can be essentially rectangular in shape and can be arranged in parallel. Each first opening 251 can, for example, have a predetermined width and a predetermined length and can be separated by a predetermined distance. The first openings 251 can further extend into the semiconductor substrate 201 a predetermined depth such that vertical surfaces within the semiconductor substrate 201 are exposed.

Figure 7:
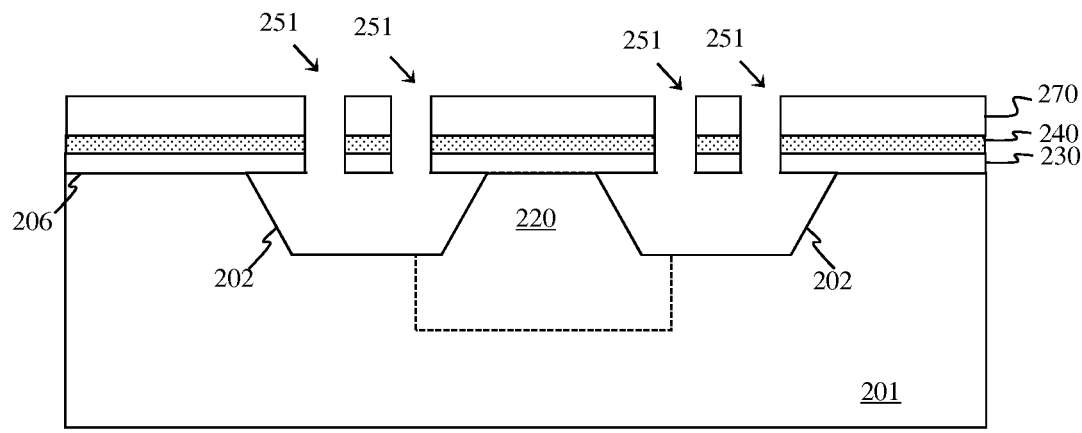
FIG. 7 is a cross-section diagram of a partially completed structure formed according to the flow diagram of FIG. 1 or FIG. 17.

Once the pair(s) of first openings are formed at process 112, the photoresist layer 271 can be selectively removed and another etch process can be performed in order to laterally expand and merge, within the semiconductor substrate only, the lower portions of the first openings 251 of each pair and, thereby to create a trench 202 associated with each pair of first openings 251 (114, see FIG. 7). That is, at process 114 exposed vertical surfaces of the semiconductor substrate 201 in the first openings 251 can be etched back in order to undercut the first semiconductor layer 230 and merge the lower portions of the first openings 251 of each pair. One such etch process can comprise an anisotropic wet etch process and, particularly, a crystallographic etch process performed using potassium hydroxide (KOH), an aqueous solution of ethylene diamine and pyrocatechol (EDP), or tetramethylammonium hydroxide (TMAH), each of which display crystallographic orientation-dependent etch rate selectivity for silicon. As a result of such a crystallographic etch process, the bottom surface of each trench 202 can remain essentially parallel to the top surface 206 of the semiconductor substrate 201 and the sidewalls can be angled, as opposed to perpendicular, relative to the top surface 206 of the semiconductor substrate 201. Alternatively, any other suitable etch process could be used that achieves the desired etch back of the vertical surfaces in the first openings 251 and, thereby creates a trench 202. Those skilled in the art will recognize that the angle of the trench sidewalls relative to the bottom surface may vary depending upon the etch process used. Those skilled in the art will further recognize that the shape of the trench sidewalls may also vary depending upon the etch process used. For example, although not shown, the trench sidewalls may alternatively be vertical, curved, chevron-shaped, etc. Finally, those skilled in the art will recognize that the size of the first openings 251 (i.e., the width, length and depth of the first openings 251), the distance between each pair of first openings 251 and the specifications for the etch process can be predetermined so that the trench 202 has a desired size (i.e., depth, length, width, etc.).

Figure 8:
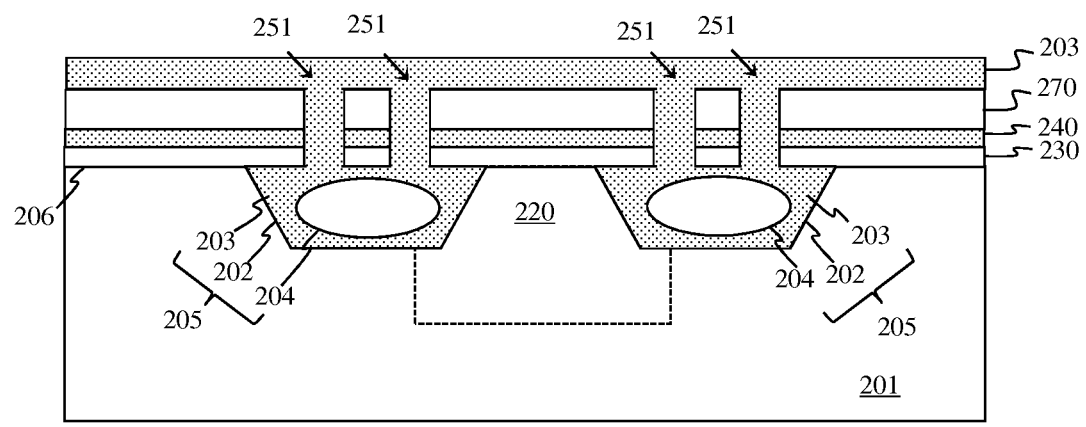
FIG. 8 is a cross-section diagram of a partially completed structure formed according to the flow diagram of FIG. 1 or FIG. 17.
Figure 9:
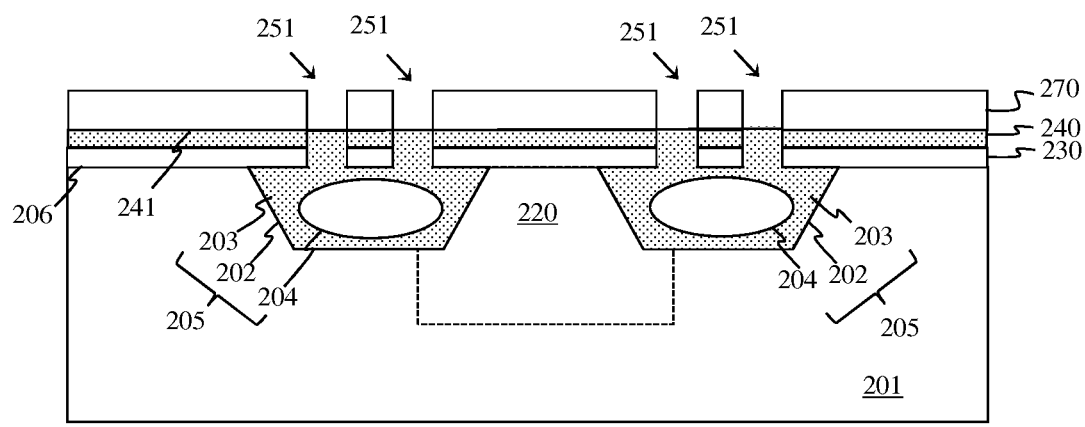
FIG. 9 is a cross-section diagram of a partially completed structure formed according to the flow diagram of FIG. 1 or FIG. 17.
Figure 10:
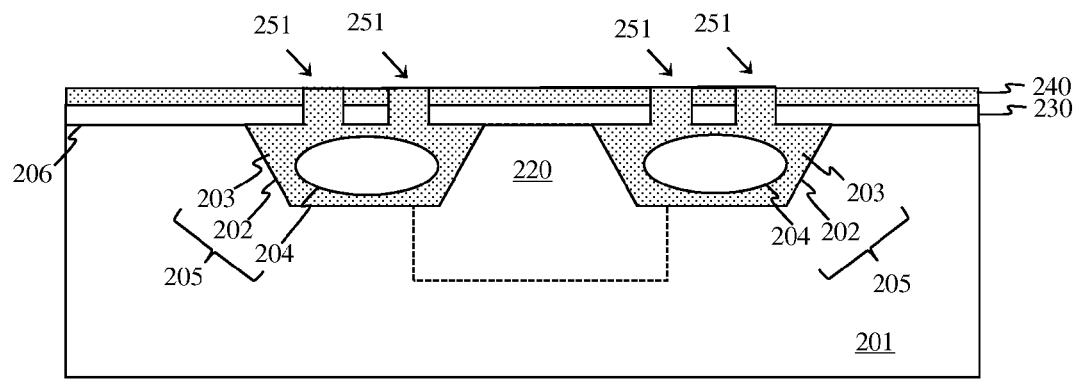
FIG. 10 is a cross-section diagram of a partially completed structure formed according to the flow diagram of FIG. 1 or FIG. 17.

Dielectric material 203 (e.g., silicon oxide, silicon nitride, silicon oxynitride or any other suitable dielectric material) can then be deposited on the sacrificial layer 270 in order to fill at least the upper portions of the first openings 251 above each trench 202 and, thereby to create an isolation region in each trench 202 (i.e., trench isolation region(s) 205) (116, see FIG. 8). It should be noted that if the first openings 251 have relatively narrow dimensions, the upper portions of the first openings 251 above each trench 202 may fill with the dielectric material 203 (i.e., pinch-off) before the entire trench 202 is filled. Thus, each trench isolation region 205 can comprise a combination of any dielectric material 203 that enters the trench 202 and an air gap 204 (i.e., a void) capped by the dielectric material 203 within upper portions of the first openings 251. After the trench isolation region(s) 205 are formed, the dielectric material 203 can be etched back to approximately the level of the top surface 241 of the dielectric layer(s) 240 (see FIG. 9) and the sacrificial layer 270 can be selectively removed (see FIG. 10).

Figure 11:
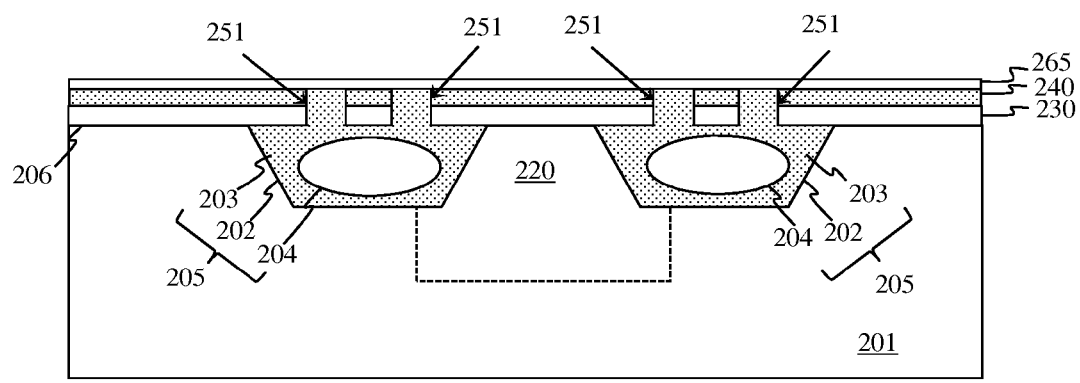
FIG. 11 is a cross-section diagram of a partially completed structure formed according to the flow diagram of FIG. 1 or FIG. 17.

Then, a second semiconductor layer 265 (e.g., a semiconductor seed layer) can be formed on the top surface 241 of the dielectric layer(s) 240 (118, see FIG. 11). This second semiconductor layer 265 can specifically be deposited such that it extends laterally over the dielectric material 203 that fills the first openings 251, such that it is relatively thin (e.g., such that it has a maximum thickness of less than 200 nm) and such that it is either amorphous or polycrystalline in structure. Those skilled in the art will recognize that different chemical vapor deposition (CVD) processes may be used to form such an amorphous or polycrystalline semiconductor seed layer (e.g., rapid thermal chemical vapor deposition (RTCVD), low pressure chemical vapor deposition (LPCVD) or plasma enhanced chemical vapor deposition (PECVD)).

Figure 12:
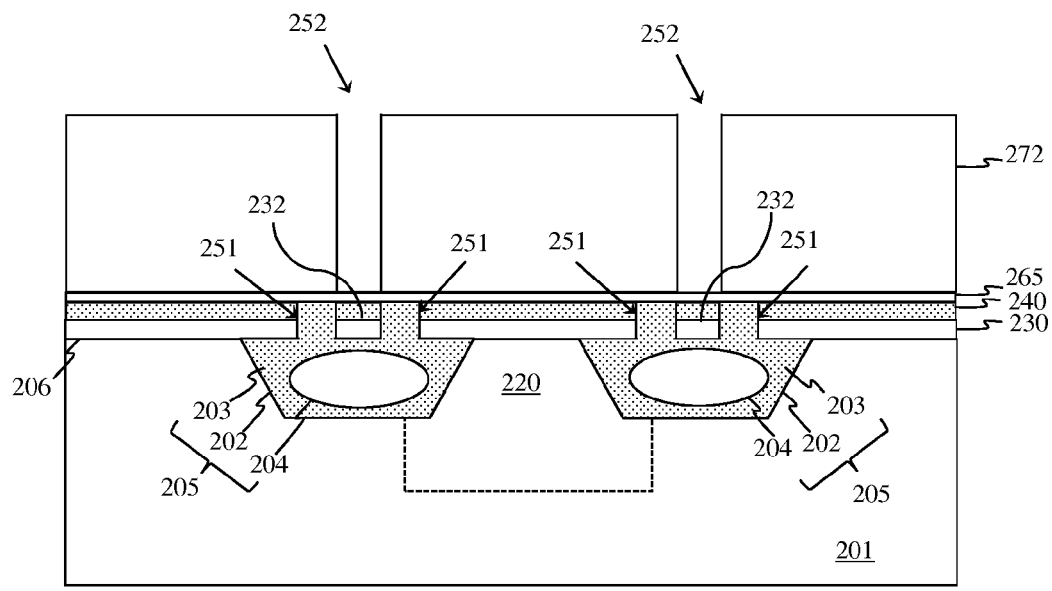
FIG. 12 is a cross-section diagram of a partially completed structure formed according to the flow diagram of FIG. 1 or FIG. 17.
Figure 13:
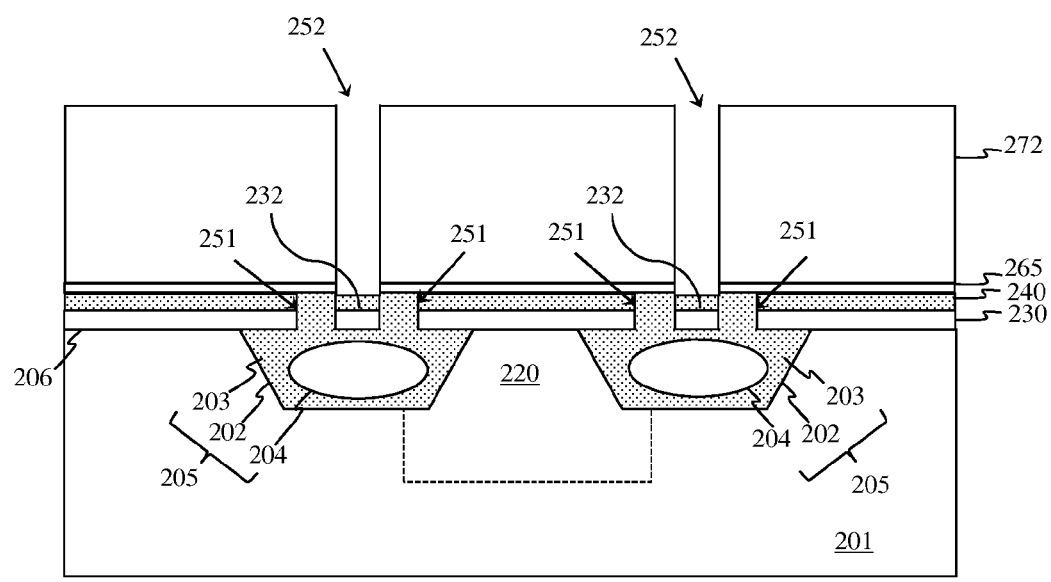
FIG. 13 is a cross-section diagram of a partially completed structure formed according to the flow diagram of FIG. 1 or FIG. 17.
Figure 14:
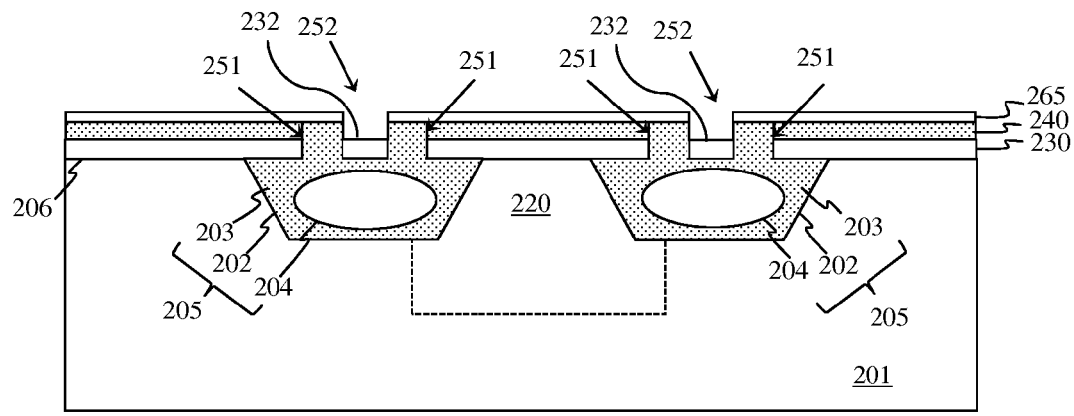
FIG. 14 is a cross-section diagram of a partially completed structure formed according to the flow diagram of FIG. 1 or FIG. 17.

Then, second opening(s) 252 can be formed such that each second opening 252 extends vertically through the second semiconductor layer 265 and dielectric layer(s) 240 to expose a monocrystalline portion 232 of the first semiconductor layer 230 in a space between first openings 251 of a given pair (120, see FIGS. 12-14). Specifically, an additional photoresist layer 272 can be formed on the second semiconductor layer 265 and lithographically patterned with one or more second openings 252, each second opening 252 can be aligned above and approximately equal in size (i.e., length and width) to a space between first openings 251 in a given pair (see FIG. 12). Next, a directional etch process can be performed to extend the second opening(s) 252 through the second semiconductor layer 265 and expose the top surface 241 of the dielectric layer(s) 240 (see FIG. 13). Finally, a pre-cleaning process (e.g., using a dilute hydrofluoric acid (HF) solution) can be performed in order to expose monocrystalline portion(s) 232 of the first semiconductor layer 230 between the first openings 251 of each pair (see FIG. 14).

Figure 15:
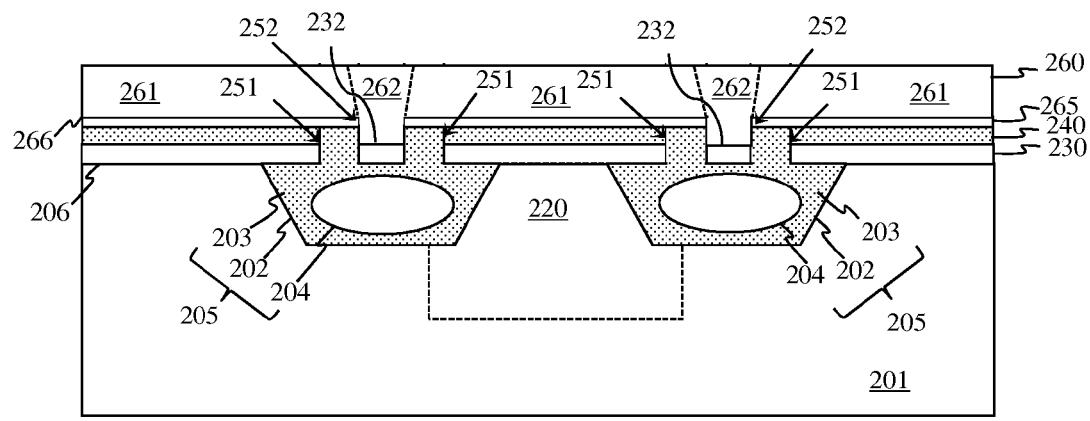
FIG. 15 is a cross-section diagram of a partially completed structure formed according to the flow diagram of FIG. 1 or FIG. 17.

Next, a third semiconductor layer 260 can be epitaxially deposited (e.g., using a non-selective, low-temperature, epitaxial deposition process) on the top surface 266 of the second semiconductor layer 265 and on the monocrystalline portion(s) 232 of the first semiconductor layer 230 in the second opening(s) 252 (122, see FIG. 15). As a result of the epitaxial deposition process, the third semiconductor layer 260 will have a polycrystalline section 261 on the second semiconductor layer 265 and monocrystalline section(s) 262 on the monocrystalline portion(s) 232 of the first semiconductor layer 230 in the second opening(s) 252.

Figure 16:
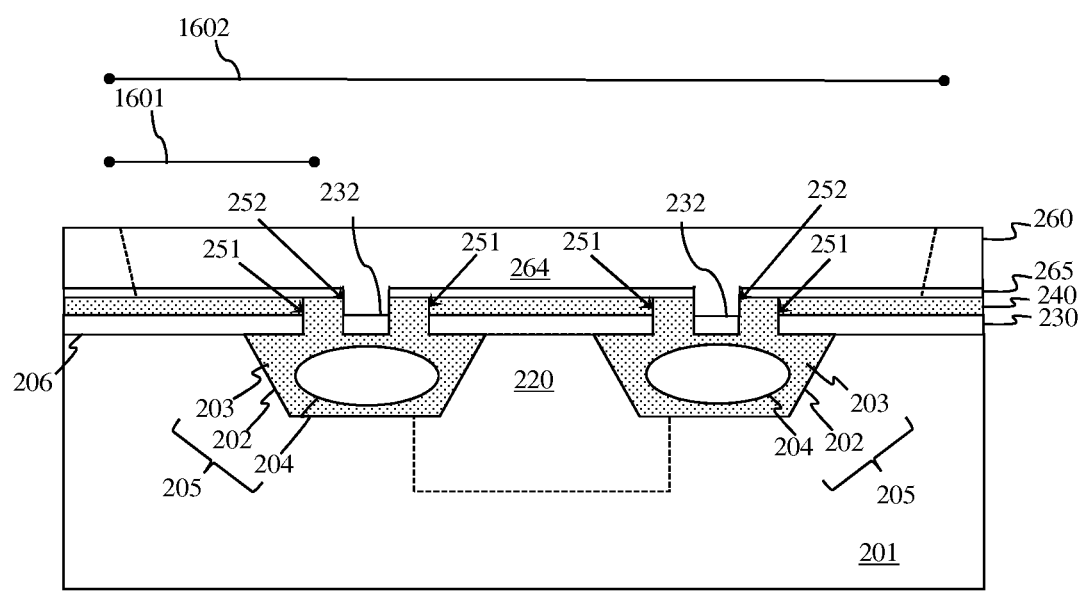
FIG. 16 is a cross-section diagram of a partially completed structure formed according to the method of FIG. 1 or FIG. 17.

Once the third semiconductor layer 260 is epitaxially deposited at process 122, an anneal process and, particularly, a solid phase epitaxy regrowth process can be performed (124, see FIG. 16). This solid phase epitaxy regrowth process can be performed so as to crystallize regions of both the second semiconductor layer 265 and the polycrystalline section 261 of the third semiconductor layer 260 adjacent to the monocrystalline section(s) 262 of the third semiconductor layer 260. This solid phase epitaxy regrowth process can comprise, for example, a low temperature thermal anneal process (e.g., a thermal anneal between 400 and 650° C. performed over a period of 30 min to 8 hours). Those skilled in the art will recognize that the crystallization distance 1601 within the second semiconductor layer 265 and third semiconductor layer 260, as measured from each second opening 252, will vary as a function of the time and temperature of the solid phase epitaxy regrowth process. Thus, the overall length 1602 of the stacked monocrystalline semiconductor material 264 of the second semiconductor layer 265 and third semiconductor layer 260 will also vary as a function of the time and temperature of the solid phase epitaxy regrowth process.

Subsequently, additional processing steps can be performed in order to incorporate the monocrystalline semiconductor layers 265, 260 into a semiconductor device (126). For example, for a bipolar device, as discussed in greater detail below, these monocrystalline semiconductor layers 265, 260 can be incorporated as extrinsic base layers; for a capacitor, these monocrystalline semiconductor layers 265, 260 can be incorporated as a capacitor plate; and so on.

Figure 17:
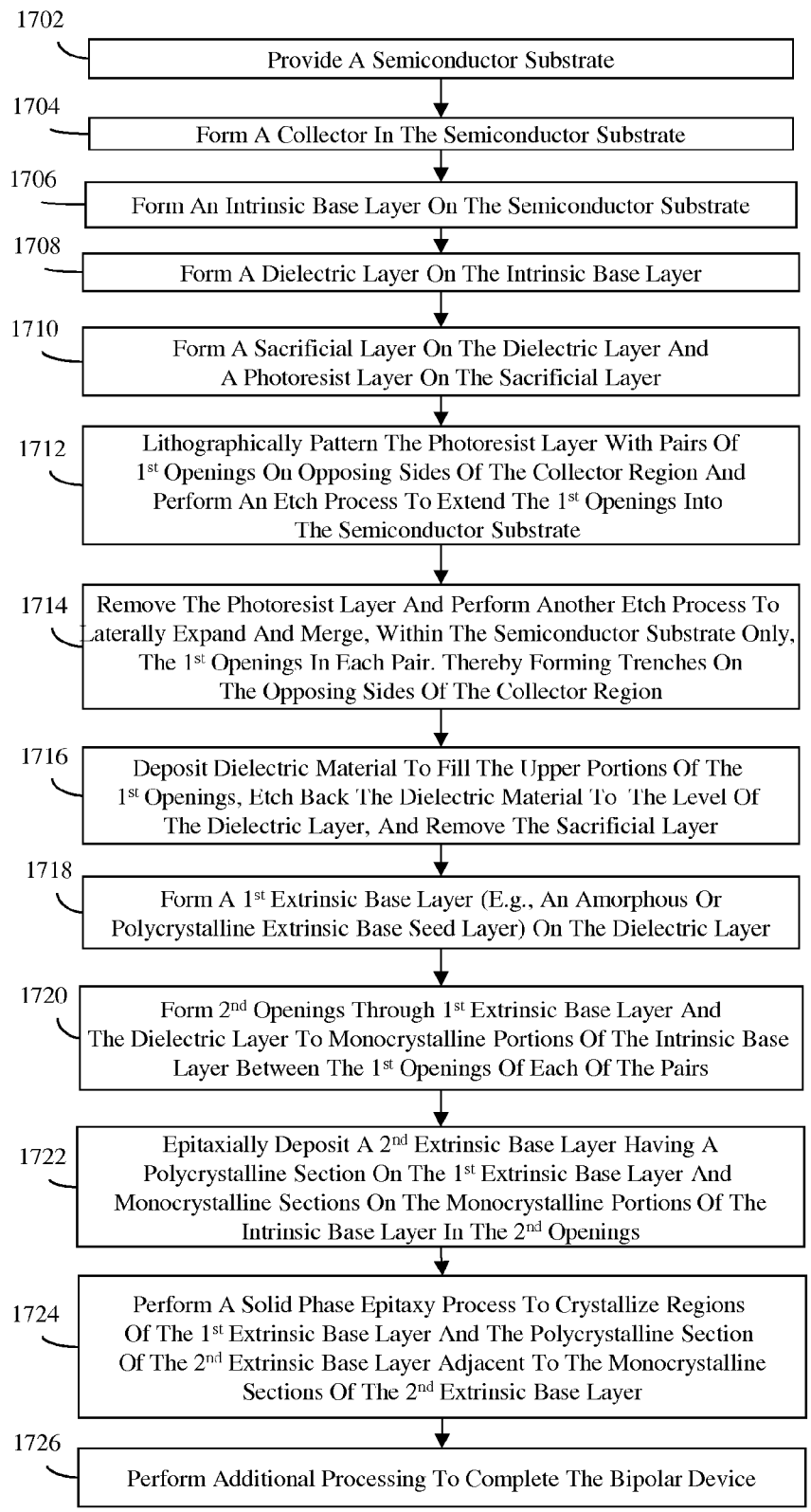
FIG. 17 is a flow diagram of a method of forming a bipolar device.

Thus, also disclosed herein is a method of forming a bipolar device (e.g., a bipolar junction transistor (BJT) or heterojunction bipolar transistor (HBT)) having extrinsic base layers (e.g., monocrystalline extrinsic base layers) on a dielectric layer over trench isolation regions. Referring to FIG. 17, in this method, a semiconductor substrate 201 and, particularly, a monocrystalline semiconductor substrate can be provided (1702, see FIG. 2). The semiconductor substrate 201 can comprise a monocrystalline semiconductor material. For example, the semiconductor substrate 201 can comprise a bulk silicon substrate or any other suitable bulk monocrystalline semiconductor substrate. Alternatively, the semiconductor substrate 201 can comprise a monocrystalline semiconductor layer of a semiconductor-on-insulator (SOI) wafer (e.g., a silicon layer of a silicon-on-insulator (SOI) wafer) (not shown). The semiconductor substrate 201 can have a first type conductivity (e.g., a P-type conductivity). Thus, for example, the semiconductor substrate 201 can comprise a P−silicon substrate (i.e., a silicon substrate having a relatively low concentration of a P-type dopant).

A dopant implant region 220 and, particularly, a collector region can be formed within the semiconductor substrate 201 (1704, see FIG. 3). This collector region 220 can be formed (e.g., implanted with a dopant) so as to have a second type conductivity (e.g., an N-type conductivity) that is different from the first type conductivity (e.g., the P-type conductivity) of the semiconductor substrate 201. Various different techniques for forming BJT and HBT collector regions having different configurations are well known in the art and can be incorporated into the methods disclosed herein. For example, the collector region 220 can be formed as a single N-well region within the semiconductor substrate 201, as shown. Alternatively, the collector region 220 can be formed as multiple N-type collector components, (e.g., an N+ buried collector within the substrate; a N− collector above the N+ buried collector; and an N+ selective implant collector (SIC) within the N− collector; etc.). Such collector components are well known in the art and, thus, the details thereof are omitted from this specification in order to allow the reader to focus on the salient aspects of the disclosed method.

Additionally, a first semiconductor layer 230 and, particularly, an intrinsic base layer can be formed (e.g., epitaxially deposited) on the top surface 206 of the semiconductor substrate 201 such that it too is monocrystalline (1706, see FIG. 3). Specifically, in the case of a BJT, the intrinsic base layer 230 formed at process 1706 can comprise, for example, a silicon layer. In the case of an HBT, the intrinsic base layer 230 formed at process 1706 can comprise, for example, a silicon layer, a silicon germanium layer, a silicon carbide layer, a silicon germanium carbide layer, or any other suitable semiconductor layer. In any case, this intrinsic base layer 230 can be formed, for example, by performing a non-selective epitaxy process (e.g., a non-selective, ultra high-vacuumchemical vapor deposition (UHV-CVD), low-temperature epitaxy (LTE) process). Those skilled in the art will recognize that, as a result of such a non-selective epitaxy process, the crystalline structure of the intrinsic base layer 230 will typically mimic that of the monocrystalline semiconductor substrate 201 below. Thus, the intrinsic base layer 230 will be formed such that it too is monocrystalline. Deposition of the intrinsic base layer 230 may proceed without any doping to alter conductivity type. Alternatively, the intrinsic base layer 230 may be uniformly in-situ doped with a first type conductivity dopant (e.g., a P-type dopant) so that the resulting intrinsic base layer 230 has the first type conductivity (e.g., P-type conductivity). Alternatively, deposition of the intrinsic base layer 230 may begin without doping such that the resulting intrinsic base layer 230 has a relatively thin un-doped lower portion. Subsequently, in-situ doping with a first type conductivity dopant (e.g., a P-type dopant) can be performed so that the resulting intrinsic base layer 230 has a, relatively thin, doped upper portion with the first type conductivity (e.g., P-type conductivity).

After the intrinsic base layer 230 is formed at process 1706, one or more dielectric layer(s) 240 can be formed (e.g., deposited) on the intrinsic base layer 230 (1708, see FIG. 4). The dielectric layer(s) 240 can comprise, for example, a silicon oxide layer, a silicon nitride layer, a silicon oxynitride layer or any other suitable dielectric layer or stack of such dielectric layers. Next, a sacrificial layer 270 (e.g., a silicon layer, a silicon germanium layer, a germanium layer, or a silicon nitride layer) can be formed (e.g., deposited) on the top surface 241 of the dielectric layer(s) 240 and a photoresist layer 271 can be formed (e.g., deposited) on the sacrificial layer 270 (1710, see FIG. 4).

Next, pairs of first openings 251 can be lithographically patterned into the photoresist layer 271 and an etch process (e.g., a non-selective anisotropic etch process) can be performed so that the first openings 251 extend vertically through the sacrificial layer 270, dielectric layer(s) 240, intrinsic base layer 230 and into the semiconductor substrate 201 below on opposing sides of the collector region 220 (1712, see FIG. 5). Specifically, one pair of first openings 251 can be lithographically patterned so as to extend into the semiconductor substrate 201 on one side of the collector region 220 and another pair of first openings 251 can be lithographically patterned so as to extend into the semiconductor substrate 201 on the opposite side of the collector region 220. As shown in the top view diagram of FIG. 6, these first openings 251 can be essentially rectangular in shape and can be arranged in parallel. Each first opening 251 can, for example, have a predetermined width and a predetermined length and can be separated by a predetermined distance. The first openings 251 can further extend into the semiconductor substrate 201 a predetermined depth such that vertical surfaces within the semiconductor substrate 201 are exposed.

Once the pairs of first openings 251 are formed at process 1712, the photoresist layer 271 can be selectively removed and another etch process can be performed in order to laterally expand and merge, within the semiconductor substrate 201 only, the lower portions of the first openings 251 of each of the pairs and, thereby to create trenches 202 on the opposing sides of the collector region 220 (1714, see FIG. 7). That is, at process 1714 exposed vertical surfaces of the semiconductor substrate 201 in the first openings 251 can be etched back in order to undercut the first semiconductor layer 230 and merge the lower portions of the first openings 251 of each pair. One such etch process can comprise an anisotropic wet etch process and, particularly, a crystallographic etch process performed using potassium hydroxide (KOH), an aqueous solution of ethylene diamine and pyrocatechol (EDP), or tetramethylammonium hydroxide (TMAH), each of which display crystallographic orientation-dependent etch rate selectivity for silicon. As a result of such a crystallographic etch process, the bottom surface of each trench 202 can remain essentially parallel to the top surface 206 of the semiconductor substrate 201 and the sidewalls can be angled, as opposed to perpendicular, relative to the top surface 206 of the semiconductor substrate 201. Alternatively, any other suitable etch process could be used that achieves the desired etch back of the vertical surfaces in the first openings 251 and, thereby creates trenches 202. Those skilled in the art will recognize that the angle of the trench sidewalls relative to the bottom surface may vary depending upon the etch process used. Those skilled in the art will further recognize that the shape of the trench sidewalls may also vary depending upon the etch process used. For example, although not shown, the trench sidewalls may alternatively be vertical, curved, chevron-shaped, etc. Finally, those skilled in the art will recognize that the size of the first openings 251 (i.e., the width, length and depth of the first openings 251), the distance between each pair of first openings 251 and the specifications for the etch process can be predetermined so that the trench 202 has a desired size (i.e., depth, length, width, etc.).

Dielectric material 203 (e.g., silicon oxide, silicon nitride, silicon oxynitride or any other suitable dielectric material) can then be deposited on the sacrificial layer 270 in order to fill at least the upper portions of the first openings 251 above each trench 202 and, thereby to create an isolation region in each trench 202 (i.e., trench isolation regions 205 on opposing sides of the collector region 220) (1716, see FIG. 8). It should be noted that if the first openings 251 have relatively narrow dimensions, the upper portions of the first openings 251 above each trench 202 may be filled with the dielectric material 203 (i.e., pinch-off) before the entire trench 202 itself is filled. Thus, each trench isolation region 205 can comprise a combination of any dielectric material 203 that enters the trench 202 and an air gap 204 (i.e., a void) capped by the dielectric material 203 within upper portions of the first openings 251. After the trench isolation regions 205 are formed, the dielectric material 203 can be etched back to approximately the level of the top surface 241 of the dielectric layer(s) 240 (see FIG. 9) and the sacrificial layer 270 can be selectively removed (see FIG. 10).

Then, a second semiconductor layer 265 and, particularly, a first extrinsic base layer (e.g., an extrinsic base seed layer) can be formed on the top surface of the dielectric layer(s) 240 (1718, see FIG. 11). This first extrinsic base layer 265 can specifically be deposited such that it covers the dielectric layer(s) 240 and extends laterally over the dielectric material 203 that fills the first openings 251, such that it is relatively thin (e.g., such that it has a maximum thickness of less than 200 nm) and such that it is either amorphous or polycrystalline in structure. In the case of either a BJT or an HBT, this first extrinsic base layer 265 can comprise a silicon layer, a silicon germanium layer, a silicon carbide layer, a silicon germanium carbide layer or any other suitable semiconductor layer. Additionally, this first extrinsic base layer 265 may be un-doped such that it has neither N-type, nor P-type conductivity. Alternatively, it may be in-situ doped or subsequently implanted with a first type conductivity dopant (e.g., a P-type dopant) such that it has the same first type conductivity as the semiconductor substrate 201 (e.g., P-type conductivity) and, if applicable, the same first type conductivity as the intrinsic base layer 230. Those skilled in the art will recognize that different chemical vapor deposition (CVD) processes may be used to form such an amorphous or polycrystalline extrinsic base layer (e.g., rapid thermal chemical vapor deposition (RTCVD), low pressure chemical vapor deposition (LPCVD) or plasma enhanced chemical vapor deposition (PECVD)).

Then, second openings 252 can be formed such that each second opening 252 extends vertically through the first extrinsic base layer 265 and dielectric layer(s) 240 to expose a monocrystalline portion 232 of the intrinsic base layer 230 in a space between the first openings 251 of a given pair (1720, see FIGS. 12-14). Specifically, an additional photo resist layer 271 can be formed on the first extrinsic base layer 265 and lithographically patterned with second openings 252, each second opening 252 can be aligned above and approximately equal in size (i.e., length and width) to a space between first openings 251 in a given pair (see FIG. 12). Next, a directional etch process can be performed to extend the second openings 252 through the first extrinsic base layer 265 and expose the top surface 241 of the dielectric layer(s) 240 (see FIG. 13). Finally, a pre-cleaning process (e.g., using a dilute hydrofluoric acid (HF) solution) can be performed in order to expose the monocrystalline portions 232 of the intrinsic base layer 230 between the first openings 251 of each pair (see FIG. 14).

Next, a third semiconductor layer 260 and, particularly, a second extrinsic base layer can be epitaxially deposited (e.g., using a non-selective, low-temperature, epitaxial deposition process) on the top surface 266 of the first extrinsic base layer 265 and on the monocrystalline portions 232 of the intrinsic base layer 230 in the second openings 252 (1722, see FIG. 15). In the case of either a BJT or an HBT, the second extrinsic base layer 260 can comprise a silicon layer, a silicon germanium layer, a silicon carbide layer, a silicon germanium carbide layer or any other suitable semiconductor layer. The second extrinsic base layer 260 can further be in-situ doped or subsequently implanted so as to have the first type conductivity (e.g., P-type conductivity). Furthermore, the concentration of first type conductivity dopant (e.g., P-type dopant) in the second extrinsic base layer 260 can, optionally, be relatively high as compared to the concentration of the same type conductivity dopant in any one or more of the first extrinsic base layer 265, the intrinsic base layer 230, and/or the semiconductor substrate 201. As a result of the epitaxial deposition process, the second extrinsic base layer 260 will have a polycrystalline section 261 on the first extrinsic base layer 265 and monocrystalline sections 262 on the monocrystalline portions 232 of the intrinsic base layer 230 in the second openings 252.

Once the second extrinsic base layer 260 is epitaxially deposited at process 1722, an anneal process and, particularly, a solid phase epitaxy regrowth process can be performed (1724, see FIG. 16). This solid phase epitaxy regrowth process can be performed so as to crystallize regions of both the first extrinsic base layer 265 and the polycrystalline section 261 of the second extrinsic base layer 260 adjacent to the monocrystalline sections 262 of the second extrinsic base layer 260. This solid phase epitaxy regrowth process can comprise, for example, a low temperature thermal anneal process (e.g., a thermal anneal between 400 and 650° C. performed over a period of 30 min to 8 hours). Those skilled in the art will recognize that the crystallization distance 1601 within the first extrinsic base layer 265 and second extrinsic base layer 260, as measured from each second opening 252, will vary as a function of the time and temperature of the solid phase epitaxy regrowth process. Thus, the overall length 1602 of the stacked monocrystalline extrinsic base semiconductor material 264 of the first extrinsic base layer 265 and second extrinsic base layer 260 will also vary as a function of the time and temperature of the solid phase epitaxy regrowth process.

Ideally the time and temperature of the solid phase epitaxy process will be predetermined in order to ensure that the monocrystalline extrinsic base semiconductor material 264 in the first extrinsic base layer 265 and second extrinsic base layer 260 is on the top surface 241 of the dielectric layer(s) 240 above the trench isolation regions 205 and further extends laterally over and essentially covers the collector region 220. For illustration purposes, the dielectric layer(s) 240 above the collector region 220 is shown in FIG. 16 as being completely covered by the monocrystalline extrinsic base semiconductor material 264. However, optionally, the solid phase epitaxy regrowth process may stop prior to this point as long as the remaining polycrystalline extrinsic base material aligned above the collector region 220 is smaller than the third opening (i.e., the emitter opening) that will subsequently be formed above the collector region 220, as discussed in greater detail below, for emitter layer formation.

Figure 18:
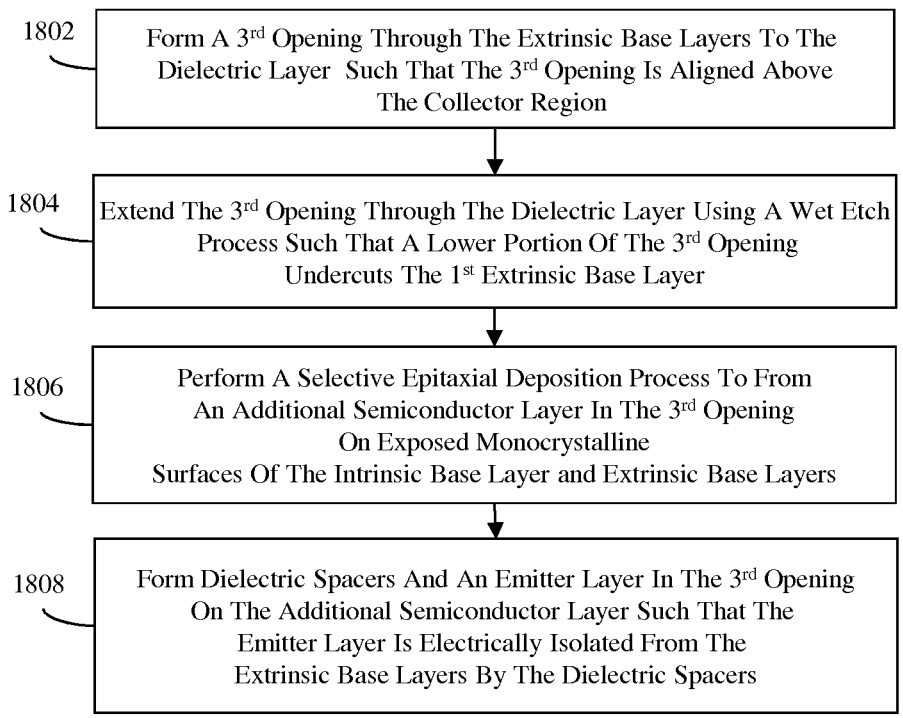
FIG. 18 is a flow diagram further illustrating process 1726 of the flow diagram of FIG. 17.
Figure 19:
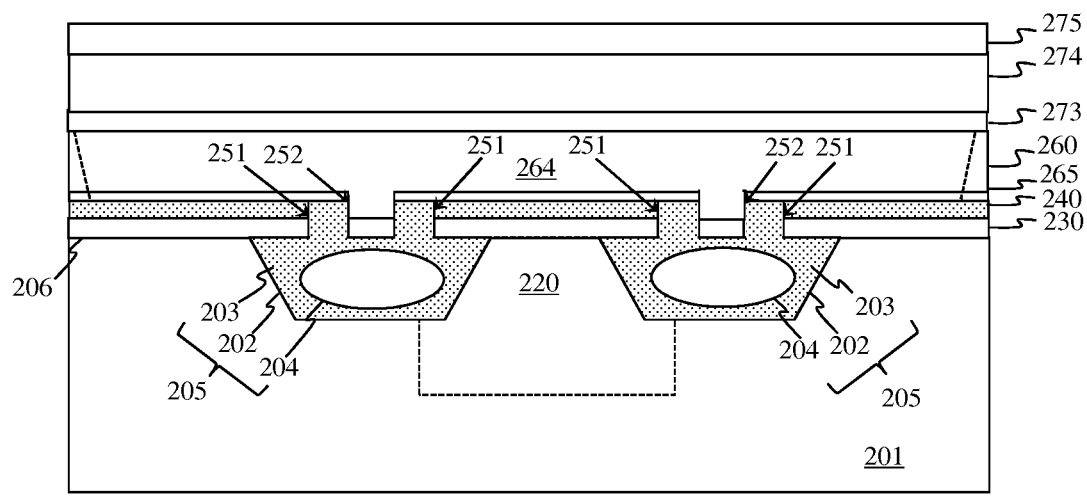
FIG. 19 is a cross-section diagram of a partially completed device formed according to the method of FIGS. 17-18.
Figure 20:
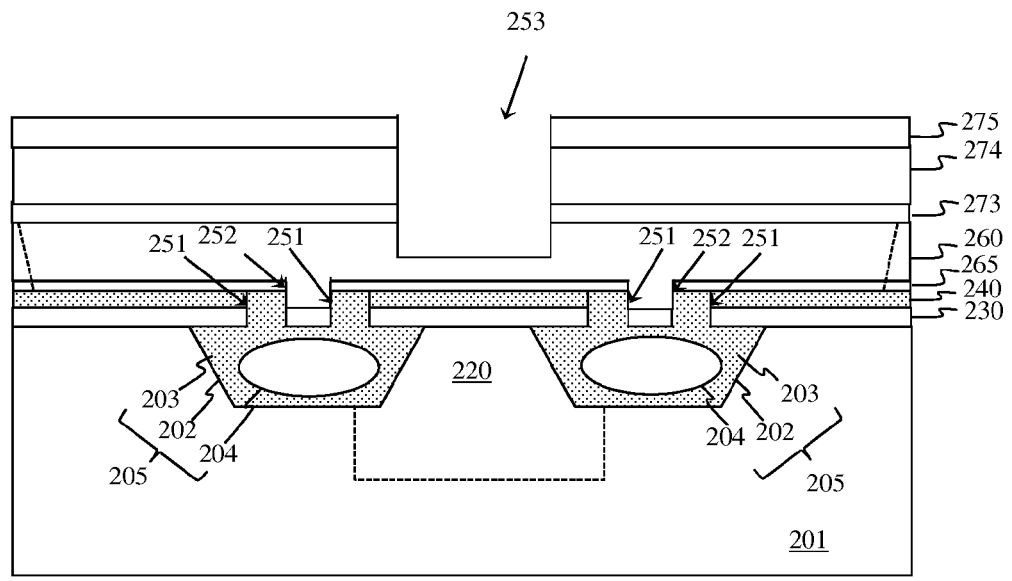
FIG. 20 is a cross-section diagram of a partially completed device formed according to the method of FIGS. 17-18.
Figure 21:
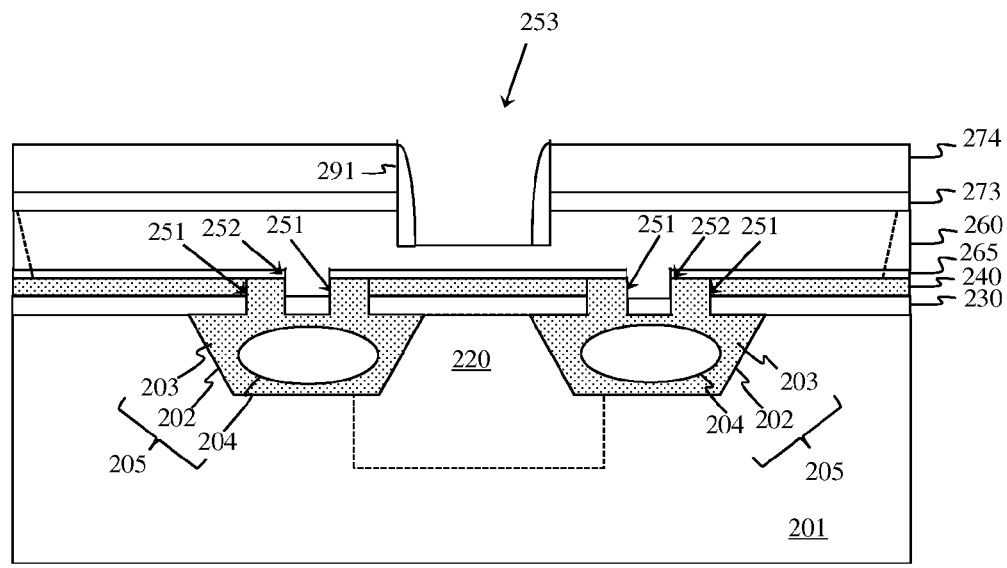
FIG. 21 is a cross-section diagram of a partially completed device formed according to the method of FIGS. 17-18.
Figure 22:
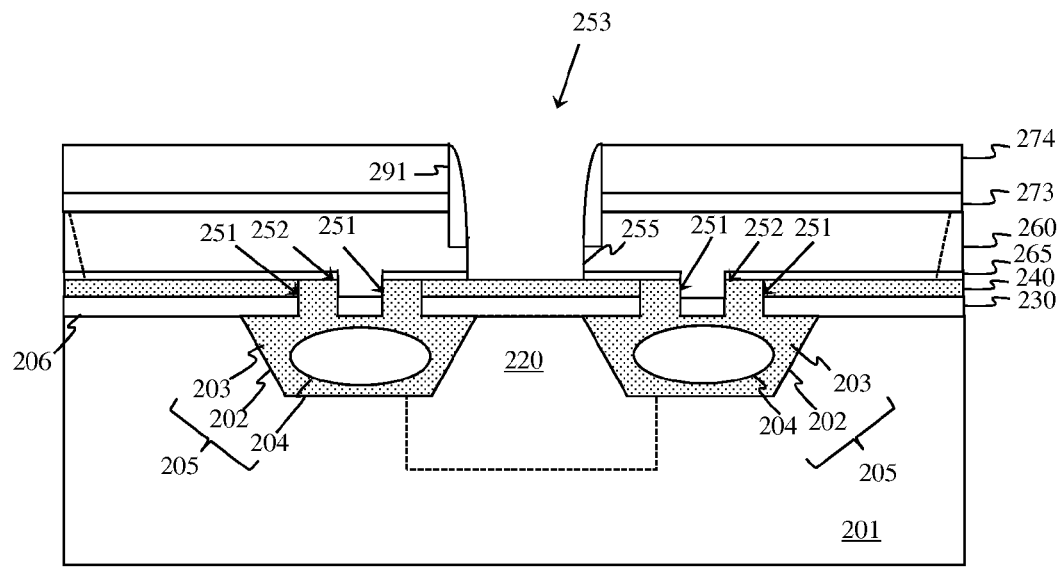
FIG. 22 is a cross-section diagram of a partially completed device formed according to the method of FIGS. 17-18.

Subsequently, additional processing steps can be performed in order to complete the bipolar device structure (1726). Specifically, referring to the flow diagram of FIG. 18, a third opening 253 (i.e., an emitter opening) can be aligned above the collector region 220 and etched through the second extrinsic base layer 260 and first extrinsic base layer 265 to the top surface 241 of the dielectric layer(s) 240 (1802, see FIGS. 19-21). For example, a stack of additional dielectric layers can be formed (e.g., deposited) on the second extrinsic base layer 260. These dielectric layers can comprise, for example, a first dielectric layer 273 (e.g., a silicon oxide layer) immediately adjacent to the second extrinsic base layer 260, a second dielectric layer 274 (e.g., a silicon nitride layer) on the first dielectric layer 273 and a third dielectric layer 275 (e.g., another silicon oxide layer) on the second dielectric layer 274 (see FIG. 19). Then, the third opening 253 can be formed (e.g., lithographically patterned and etched) such that it extends vertically through the dielectric layers 273-275 and into, but not completely through, the second extrinsic base layer 260 (see FIG. 20). Then, a first dielectric spacer 291 (e.g., a silicon nitride spacer) can be formed, using conventional sidewall spacer formation techniques, on the sidewall of the third opening 253 (see FIG. 21). After the first dielectric spacer 291 is formed, the third opening 253 can be extended (i.e., further etched) through the remaining second extrinsic base layer 260 and the first extrinsic base layer 265 to expose the top surface 241 of the dielectric layer(s) 240 as well as vertically aligned sidewalls 255 of the second extrinsic base layer 260 and first extrinsic base layer 265 within the third opening 253 (see FIG. 22).

Figure 23:
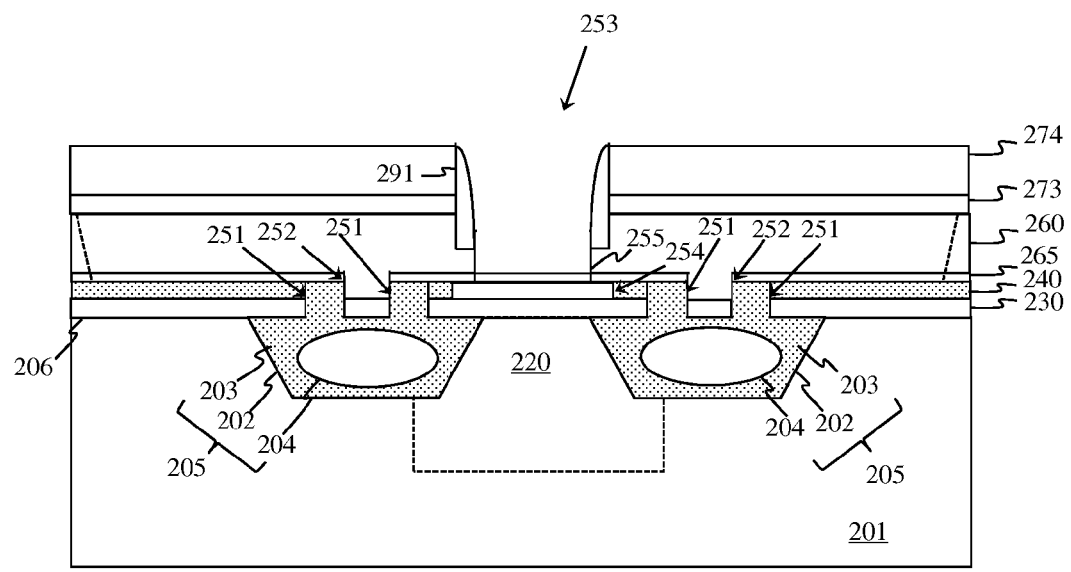
FIG. 23 is a cross-section diagram of a partially completed device formed according to the method of FIGS. 17-18.

This third opening 253 can further be extended through the dielectric layer(s) 240 using a wet etch process such that a lower portion 254 of this third opening 253 undercuts the first extrinsic base layer 265 (1804, see FIG. 23). Thus, following processes 1802-1804, the third opening 253 exposes the following monocrystalline surfaces: the vertically aligned sidewalls 255 of the first extrinsic base layer 265 and second extrinsic base layer 260; a portion of the top surface 235 of the intrinsic base layer 230 above the collector region 220, and a portion of the bottom surface 257 of the first extrinsic base layer 265 where the lower portion 254 of the third opening 253 undercuts the first extrinsic base layer 265.

Figure 24:
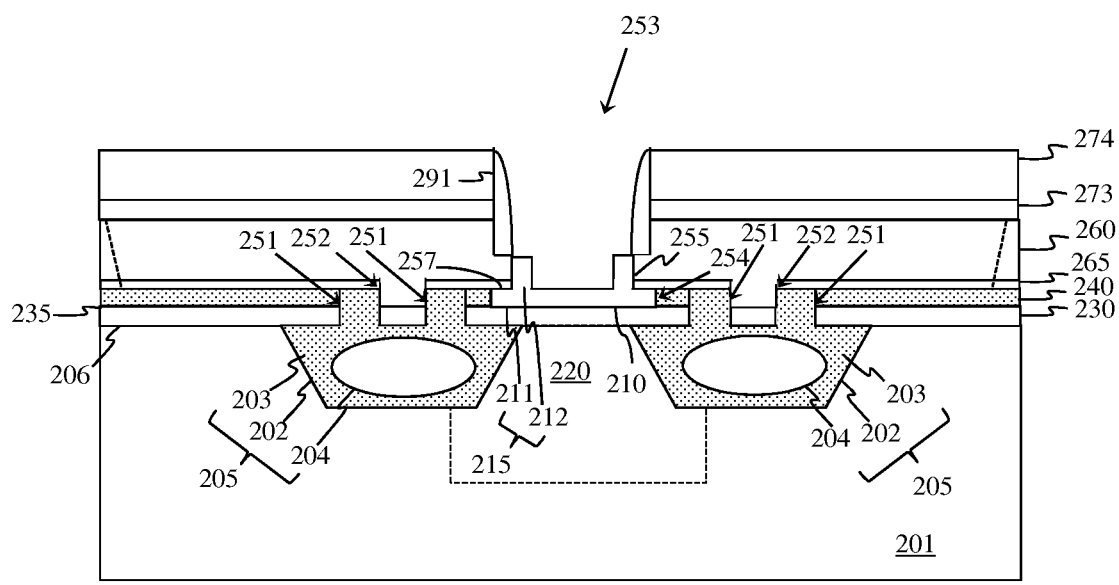
FIG. 24 is a cross-section diagram of a partially completed device formed according to the method of FIGS. 17-18.

Next, a selective epitaxial deposition process can be performed in order to form an additional semiconductor layer 210 (i.e., a fourth semiconductor layer) within the third opening 253 on the exposed monocrystalline surfaces of the intrinsic base layer 230 and the first and second extrinsic base layers 265, 260, discussed above (1806, see FIG. 24). In the case of a BJT, this additional semiconductor layer 210 can comprise, for example, a silicon layer. In the case of an HBT, this additional semiconductor layer 210 can comprise, for example, a silicon germanium layer, a silicon germanium carbide layer or a silicon carbide layer. This additional semiconductor layer 210 can fill the lower portion 254 of the third opening 253 such that an edge portion 211 of the additional semiconductor layer 210 is stacked vertically between the top surface 235 of the intrinsic base layer 230 and the bottom surface 257 of the first extrinsic base layer 265. This additional semiconductor layer 210 can further have a vertical extension 212 positioned laterally adjacent to the aligned vertical sidewalls 255 of the first and second extrinsic base layers 265, 260 above the lower portion 254 of the third opening 253. Since the epitaxial semiconductor material for additional semiconductor layer 210 is selectively grown on monocrystalline surfaces only of the intrinsic and extrinsic base layers, the additional semiconductor layer 210 will be entirely monocrystalline in structure. As a result, the edge portion 211 and the vertical extension 212 of the additional semiconductor layer 210 can create an entirely monocrystalline link-up region 215 between the intrinsic base layer 230 and the first and second extrinsic base layers 265, 260. Additionally, it should be noted that the interfaces between the monocrystalline semiconductor material grown on the different and, particularly, opposing top and bottom monocrystalline surfaces of the intrinsic base layer and first extrinsic base layer, respectively, will be uniform, thereby minimizing the occurrence of voids within the additional semiconductor layer 210 and, particularly, within the link-up region (i.e., portions 211 and 212 of the additional semiconductor layer 210) that would increase resistance. Optionally, deposition of the additional semiconductor layer at process 1806 can proceed without doping to alter the conductivity type. Alternatively, the additional semiconductor layer 210 can be in-situ doped or subsequently implanted with a dopant so as to have the first type conductivity (e.g., P-type conductivity) at the same or different conductivity levels than the semiconductor substrate 201, the intrinsic base layer 230, the first extrinsic base layer 265 and/or the second extrinsic base layer 260.

It should be noted that in the process steps described above and illustrated in FIGS. 17-18, the intrinsic base layer 230, the first extrinsic base layer 265, the second extrinsic base layer 260 and the additional semiconductor layer 210 can each be formed so as to comprise the same semiconductor material (e.g., silicon, silicon germanium, silicon carbide or silicon germanium carbide). Alternatively, any two or more of the layers 230, 265, 260 and 210 may be formed so as to comprise different semiconductor materials (e.g., silicon and silicon germanium, silicon carbide or silicon germanium carbide; silicon germanium and silicon carbide or silicon germanium carbide, etc.). Furthermore, any one or more of the layers 230, 265, 260 and 210 may be un-doped or doped so as to have the same conductivity type at a different conductivity level than the other layers.

Figure 25:
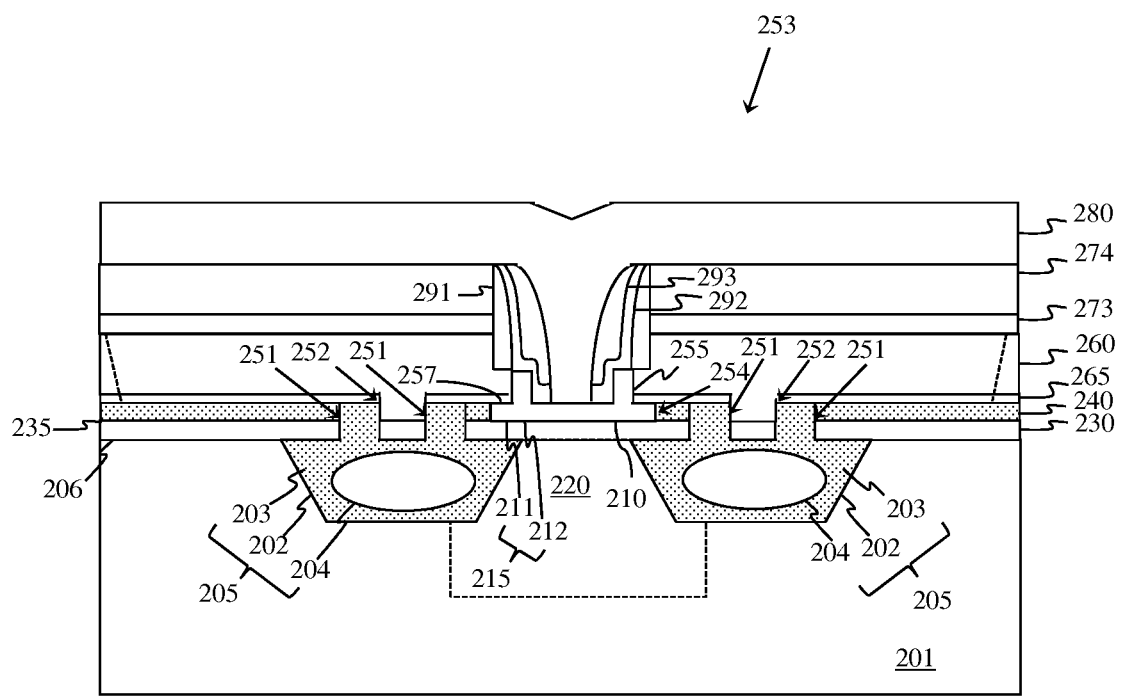
FIG. 25 is a cross-section diagram of a partially completed device formed according to the method of FIGS. 17-18.

Following additional semiconductor layer formation at process 1806, dielectric spacers (e.g., see dielectric spacers 292-293) and an emitter layer 280 can be formed on the additional semiconductor layer 210 within the third opening 253 such that the emitter layer 280 is electrically isolated from the first and second extrinsic base layers 265, 260 by those dielectric spacers (1808, see FIG. 25). For example, a conformal dielectric layer (e.g., a silicon oxide layer) can be deposited so as to line the third opening 253 and yet another dielectric layer (e.g., a silicon nitride layer) can be deposited on the conformal dielectric layer. Then, etch processes can be performed so as to expose the center portion of the additional semiconductor layer 210, thereby creating a second dielectric spacer 292 and a third dielectric spacer 293. The second dielectric spacer 292 (e.g., a silicon oxide spacer) can be positioned laterally adjacent to the previously formed first dielectric spacer 291 and can further cover the top surface of the additional semiconductor layer vertical extension 212 as well as the sidewall of the additional semiconductor layer vertical extension 212 opposite the vertically aligned sidewalls 255 of the first extrinsic base layer 265 and second extrinsic base layer 260. The third dielectric spacer 293 (e.g., a silicon nitride spacer) can be positioned laterally adjacent to the second dielectric spacer 292.

Figure 26:
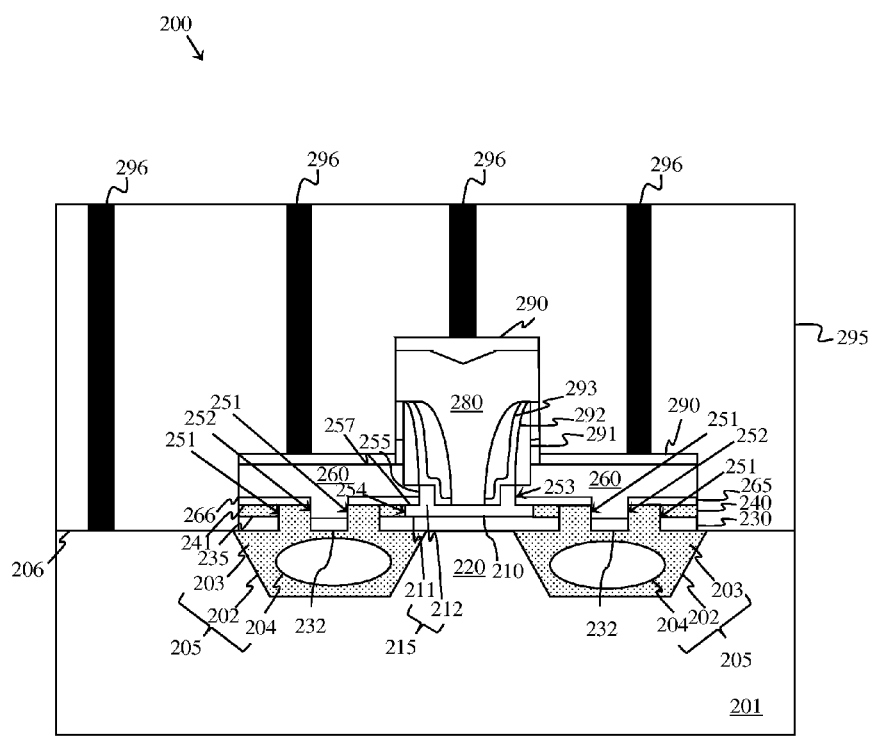
FIG. 26 is a cross-section diagram of a completed device formed according to the method of FIGS. 17-18.

Next, an emitter layer 280 can be deposited so as to fill the third opening 253 (see FIG. 26). The emitter layer 280 can comprise, for example, a polycrystalline semiconductor layer (e.g., a polycrystalline silicon layer) that is in-situ doped or subsequently implanted with a dopant so as to have the same second type conductivity as the collector region 220 (e.g., N-type conductivity). It should be noted that at some point during processing (e.g., before formation of the third opening 253 or after emitter layer 280 formation), the stack comprising the intrinsic base layer 230, the dielectric layer(s) 240, the first extrinsic base layer 265, and the second extrinsic base layer can be patterned and etched such that only monocrystalline extrinsic base material remains within the bipolar device.

Finally, conventional processing techniques can be used to pattern and etch the emitter layer 280 to create the conventional T-shape, to form optional metal silicide layer(s) 290 on the top surfaces of the second extrinsic base layer 260 and the emitter layer 280, to cover the bipolar device with one or more interlayer dielectric(s) 295, to form contacts 296 to the second extrinsic base layer 260, the emitter layer 280, the semiconductor substrate 201, etc. (see FIG. 26). Various different techniques for forming these features are well known in the art and, thus, are omitted from this specification in order to allow the reader to focus on the salient aspects of the disclosed methods. However, it should be understood that any of these various techniques could be incorporated into the different methods disclosed.

Referring to FIG. 26, also disclosed herein is a bipolar device 200 (e.g., a bipolar junction transistor (BJT) or a heterojunction bipolar transistor (HBT)) formed, according to the method described above.

This bipolar device 200 can comprise a semiconductor substrate 201. The semiconductor substrate 201 can comprise a monocrystalline semiconductor material. For example, the semiconductor substrate 201 can comprise a bulk silicon substrate or any other suitable bulk monocrystalline semiconductor substrate, as illustrated in FIG. 26. Alternatively, the semiconductor substrate 201 can comprise a monocrystalline semiconductor layer of a semiconductor-on-insulator (SOI) wafer (e.g., a silicon layer of a silicon-on-insulator (SOI) wafer) (not shown). The semiconductor substrate 201 can have a first type conductivity (e.g., a P-type conductivity). Thus, for example, the semiconductor substrate 201 can comprise a P-silicon substrate (i.e., a silicon substrate having a relatively low concentration of a P-type dopant). The semiconductor substrate 201 can comprise trench isolation regions 205 and a dopant implant region 220 and, particularly, a collector region positioned laterally between the trench isolation regions 205.

The collector region 220 can be within and at the top surface of the semiconductor substrate 201. The collector region 220 can have a second type conductivity (e.g., an N-type conductivity) that is different from the first type conductivity of the semiconductor substrate 201. The collector region 220 can comprise a single N-well region. Alternatively, the collector region 220 can comprise multiple N-type collector components comprising dopant implant regions, having different dopant concentrations and, thereby different conductivity levels (e.g., an N+ buried collector within the semiconductor substrate; a N-collector above the N+ buried collector and extending to the top surface of the semiconductor substrate; an N+ selective implant collector (SIC) within the N-collector immediately adjacent to the N+ buried collector; etc.). Such collector components are well known in the art and, thus, the details thereof are omitted from this specification in order to allow the reader to focus on the salient aspects of the disclosed bipolar device.

The trench isolation regions 205 on opposing sides of the collector region 220 can comprises trenches 202. Each trench 202 can extend into the semiconductor substrate 201 a predetermined depth, as measured from the top surface 206 of the semiconductor substrate 201. Each trench 202 can have a bottom surface that is essentially parallel to the top surface 206 of the semiconductor substrate 201. Each trench 202 can further have sidewalls that are angled (as opposed to perpendicular) relative to the top surface 206 of the semiconductor substrate 201 (as shown). Alternatively, as discussed above with regard to the disclosed methods, the trench sidewalls may be vertical, curved, chevron-shaped, etc. (not shown). Each trench 202 can contain dielectric material 203, which either fills the trench (not shown) or caps off an air gap 204 (i.e., a void) contained within the trench 202.

The bipolar device 200 can further comprise a first semiconductor layer 230 and, particularly, an intrinsic base layer positioned on and immediately adjacent to (i.e., in contact with) the top surface of the monocrystalline semiconductor substrate 201 above the collector region 220 and further extending laterally over the trench isolation regions 205. In the case of a BJT, this intrinsic base layer 230 can comprise a silicon layer. In the case of an HBT, this intrinsic base layer 230 can comprise a silicon germanium layer, a silicon carbide layer, a silicon germanium carbide layer, or any other suitable semiconductor layer. In any case, during processing, as discussed in detail above with regard to the methods, this intrinsic base layer 230 can be epitaxially deposited onto the monocrystalline semiconductor substrate 201 prior to formation of the trench isolation regions 205 such that this intrinsic base layer 230 is monocrystalline in structure. The intrinsic base layer 230 may, optionally, have a relatively thin un-doped lower portion that it has neither N-type, nor P-type conductivity and further may have a relatively thin upper portion that is doped with a specific concentration of a first type conductivity dopant (e.g., a P-type dopant) such that it has the same type conductivity as the semiconductor substrate 201 (e.g., P-type conductivity).

The bipolar device 200 can further comprise one or more dielectric layer(s) 240 positioned on the top surface of the intrinsic base layer 230. The dielectric layer(s) 240 can comprise, for example, a silicon oxide layer, a silicon nitride layer, a silicon oxynitride layer or any other suitable dielectric layer or stack of such dielectric layers. Pairs of first openings 251 can extend vertically through the dielectric layer(s) 240 and the intrinsic base layer 230. Each pair of first openings 251 can be aligned above a corresponding trench isolation region 205. The first openings 251 in each pair can be essentially rectangular in shape and can be arranged in parallel. Each first opening 251 can have a predetermined width and a predetermined length. Additionally, the first openings 251 in each pair can be separated by a predetermined distance (see detailed discussion above with regard to the methods). These first openings 251 can be filled with dielectric material 203 and, as mentioned above, this dielectric material 203 may also fill or cap off an air gap 204 within the trench isolation regions 205 below.

The bipolar device 200 can further comprise a second semiconductor layer 265 and, more particularly, a first extrinsic base layer (e.g., an extrinsic base seed layer) on the top surface 241 of the dielectric layer(s) 240. This first extrinsic base layer 265 can extend laterally over the dielectric material 203, which fills the first openings 251 of each of the pairs. This first extrinsic base layer 265 can be relatively thin (e.g., such that it has a maximum thickness of less than 200 nm). In the case of either a BJT or an HBT, this first extrinsic base layer 265 can comprise a silicon layer, a silicon germanium layer, a silicon carbide layer, a silicon germanium carbide layer or any other suitable semiconductor layer. Additionally, this first extrinsic base layer 265 may be un-doped such that it has neither N-type, nor P-type conductivity. Alternatively, it may be in-situ doped or subsequently implanted with a first type conductivity dopant (e.g., a P-type dopant) such that it has the same first type conductivity as the semiconductor substrate 201 (e.g., P-type conductivity) and, if applicable, the same first type conductivity as the intrinsic base layer 230. Second openings 252 can extend vertically through the first extrinsic base layer 265 and the dielectric layer(s) 240 to monocrystalline portions 232 of the intrinsic base layer 230 between the first openings 251 of each of the pairs.

The bipolar device 200 can further comprise a third semiconductor layer 260 and, particularly, a second extrinsic base layer positioned on the top surface 266 of the first extrinsic base layer 265 and on the monocrystalline portions 232 of the intrinsic base layer 230 within the second openings 252. In the case of either a BJT or an HBT, the second extrinsic base layer 260 can comprise a silicon layer, a silicon germanium layer, a silicon carbide layer, a silicon germanium carbide layer or any other suitable semiconductor layer. The second extrinsic base layer 260 can further be in-situ doped or subsequently implanted so as to have the first type conductivity (e.g., P-type conductivity). Furthermore, the concentration of first type conductivity dopant (e.g., P-type dopant) in the second extrinsic base layer 260 can, optionally, be relatively high as compared to the concentration of the same type conductivity dopant in any one or more of the first extrinsic base layer 265, the intrinsic base layer 230, and/or the semiconductor substrate 201. The first and second extrinsic base layers 265, 260 can be monocrystalline. More particularly, the extrinsic base semiconductor material of both the first and second extrinsic base layers 265, 260 above the trench isolation regions 205 and over the portion of the semiconductor substrate 201 between the trench isolation regions 205 (i.e., over the collector region 220 within the semiconductor substrate 201) will be entirely monocrystalline.

A third opening 253 can be aligned above the collector region 220 (i.e., between the trench isolation regions 205) and can extend vertically through the second extrinsic base layer 260, first extrinsic base layer 265 and the dielectric layer(s) 240 to the intrinsic base layer 230. Additionally, the lower portion 254 of this third opening 253 within the dielectric layer(s) 240 can undercut the first extrinsic base layer 265 (i.e., can be relatively wide as compared to the upper portion of the third opening 253). Thus, during formation of the third opening, monocrystalline surfaces of the intrinsic base layer 230, the first extrinsic base layer 265 and the second extrinsic base layer 260 are exposed. These monocrystalline surfaces include the top surface 235 of the intrinsic base layer 230 and the bottom surface 257 of the first extrinsic base layer 265 within the lower portion 254 of the third opening 253 and the aligned vertical surfaces 255 of the first and second extrinsic base layers 265, 260 in the upper portion of the third opening 253 above the lower portion 254.

The bipolar device 200 can further comprise a fourth semiconductor layer 210 (i.e., an additional semiconductor layer) within the third opening 253 on the monocrystalline surfaces of the intrinsic base layer 230 and the first and second extrinsic base layers 265, 260, as discussed above. In the case of a BJT, this additional semiconductor layer 210 can comprise, for example, a silicon layer. In the case of an HBT, this additional semiconductor layer 210 can comprise, for example, a silicon germanium layer, a silicon germanium carbide layer or a silicon carbide layer. This additional semiconductor layer 210 can fill the lower portion 254 of the third opening 253 such that an edge portion 211 of the additional semiconductor layer 210 is stacked vertically between the top surface 235 of the intrinsic base layer 230 and the bottom surface 257 of the first extrinsic base layer 265. This additional semiconductor layer 210 can further have a vertical extension 212 positioned laterally adjacent to the aligned vertical sidewalls 255 of the first and second extrinsic base layers 265, 260 above the lower portion 254 of the third opening 253. Since, as discussed in detail above with regard to the method, the additional semiconductor layer 210 is selectively epitaxially grown on only monocrystalline surfaces of the intrinsic and extrinsic base layers, the additional semiconductor layer 210 will be entirely monocrystalline in structure. As a result, the edge portion 211 and the vertical extension 212 of the additional semiconductor layer 210 create an entirely monocrystalline link-up region 215 between the intrinsic base layer 230 and the first and second extrinsic base layers 265, 260. Additionally, it should be noted that the interfaces between the monocrystalline semiconductor material grown on the different and, particularly, opposing top and bottom monocrystalline surfaces of the intrinsic base layer and first extrinsic base layer, respectively, will be uniform, thereby minimizing the occurrence of voids within the additional semiconductor layer 210 and, particularly, within the link-up region (i.e., portions 211 and 212 of the additional semiconductor layer 210) that would increase resistance. Optionally, the additional semiconductor layer 210 can be un-doped. Alternatively, the additional semiconductor layer 210 can be in-situ doped or subsequently implanted with a dopant so as to have the first type conductivity (e.g., P-type conductivity) at the same or different conductivity levels than the semiconductor substrate 201, the intrinsic base layer 230, the first extrinsic base layer 265 and/or the second extrinsic base layer 260.

It should be noted in the bipolar device 200, the intrinsic base layer 230, the first extrinsic base layer 265, the second extrinsic base layer 260 and the additional semiconductor layer 210 can each comprise the same semiconductor material (e.g., silicon, silicon germanium, silicon carbide or silicon germanium carbide). Alternatively, any two or more of the layers 230, 265, 260 and 210 can comprise different semiconductor materials (e.g., silicon and silicon germanium, silicon carbide or silicon germanium carbide; silicon germanium and silicon carbide or silicon germanium carbide, etc.). Furthermore, any one or more of the layers 230, 265, 260 and 210 can be un-doped or doped so as to have the same conductivity type at a different conductivity level than the other layers.

In such a bipolar device 200, the monocrystalline extrinsic base layers 265, 260 provide reduced base resistance $R_b$ and the trench isolations regions 205 below, particularly, with air gaps 204, provide reduced collector-to-base capacitance $C_{cb}$.

As a result, the bipolar device 200 can achieve a relatively high transit frequency $f_T$ and maximum oscillation frequency $f_{max}$.

As with conventional bipolar junction transistors (BJTs) and conventional heterojunction bipolar transistors (HBTs), the bipolar device 200 disclosed herein and illustrated in FIG. 26 can further comprise additional features including, but not limited to, an emitter layer 280, dielectric spacers 291-293, metal silicide layer(s) 290, interlayer dielectrics 295, contacts 296, etc. Various different configurations for these additional features are well known in the art and can be incorporated into different bipolar device structures.

For example, as shown in FIG. 26, the emitter layer 280 (e.g., an essentially T-shaped emitter layer) can be positioned on the additional semiconductor layer 210 within the third opening 253 such that it is aligned above the collector region 220. Specifically, the essentially T-shaped emitter layer 280 can have a relatively narrow section that extends vertically through third opening 253 in extrinsic base layers 265, 260 and to the additional semiconductor layer 210 and a relatively wide section above the narrow section. The emitter layer 280 can comprise, for example, a polycrystalline semiconductor layer (e.g., a polycrystalline silicon layer) having the same second type conductivity as the collector region 220 (e.g., N-type conductivity).

At least one dielectric spacer (e.g., see dielectric spacers 291-293) can also be positioned within the third opening 253 and can electrically isolate the narrow section of the emitter layer 280 from the extrinsic base layers 265, 260. For example, the third opening 253 (i.e., the emitter opening) can have an upper portion that extends vertically into, but not through, the second extrinsic base layer 260. A first dielectric spacer 291 (e.g., a silicon nitride spacer) can be positioned laterally adjacent to the sidewall of this upper portion of the third opening 253. A second dielectric spacer 292 (e.g., a conformal silicon oxide spacer) can be positioned laterally adjacent to the first dielectric spacer 291 and can further cover the top surface of the additional semiconductor layer vertical extension 212 as well as the sidewall of the additional semiconductor layer vertical extension 212 opposite the aligned vertical sidewalls 255 of the first extrinsic base layer 265 and second extrinsic base layer 260. Finally, a third dielectric spacer 293 (e.g., another silicon nitride spacer) can be positioned laterally between the second dielectric spacer 292 and the narrow portion of the emitter layer 280.

Metal silicide layer(s) 290 can, optionally, be positioned on the top surface of the second extrinsic base layer 260 and the top surface of the emitter layer 280. Such metal silicide layers 290 can comprise silicides of, for example, a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof. It should be noted that, if applicable, the dielectric spacer(s) 291-293 can also isolate the lower portion of the emitter layer 280 from any metal silicide layer 290 on the extrinsic base layer 260.

One or more interlayer dielectric(s) 295 (i.e., additional dielectric layers) can blanket (i.e., cover) the bipolar device 200, as described above. These interlayer dielectric(s) 295 can comprise, for example, any suitable interlayer dielectric material(s). For example, the interlayer dielectric(s) 295 can comprise any of silicon oxide, silicon nitride, borophosphosilicate glass, etc. Finally, contacts 296 can extend vertically through the interlayer dielectric(s) 295 in order to contact the second extrinsic base layer 260, the emitter layer 280, semiconductor substrate 201, etc.

It should be noted that in the semiconductor devices and methods described above, the first type conductivity is referred to as being P-type conductivity and the second type conductivity is referred to as being N-type conductivity. However, alternatively, the reverse can be true. That is, the first type conductivity can comprise N-type conductivity and the second type conductivity can comprise P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having a N-type conductivity is typically doped with silicon (Si). Those skilled in the art will also recognize that different conductivity levels will depend upon the relative concentration levels of the dopants.

It should also be noted that the terminology used herein is for the purpose of describing the structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including", specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The above-description has been presented for purposes of illustration, but is not intended to be exhaustive or limiting. Many modifications and variations to the structures and methods will be apparent to those of ordinary skill in the art without departing from the scope and spirit of those structures and methods.

Therefore, disclosed above are semiconductor devices and methods of forming such devices that include forming semiconductor layers (e.g., monocrystalline semiconductor layers) on a dielectric layer over one or more trench isolation region(s). In the methods, pair(s) of first openings can be formed through a dielectric layer and a first semiconductor layer into a semiconductor substrate and, within the substrate, the first openings of the pair(s) can be expanded laterally and merged to form trench(es). Dielectric material can then be deposited to fill the upper portions of the first openings, thereby forming trench isolation region(s). An second, amorphous or polycrystalline, semiconductor layer can be deposited on the dielectric layer and second opening(s) can be formed through the second semiconductor layer and dielectric layer to monocrystalline portion(s) of the first semiconductor layer between the first openings of each of the pair(s). A third semiconductor layer can be epitaxially deposited so as to have a polycrystalline section on the second semiconductor layer and monocrystalline section(s) on the monocrystalline portion(s) of the first semiconductor layer within the second opening(s). A solid phase epitaxy regrowth process can be used to crystallize semiconductor material adjacent to the monocrystalline section(s) of the third semiconductor layer.

Then, a semiconductor device can be formed that incorporates the resulting monocrystalline second and third semiconductor layers. For example, a bipolar device, such as a bipolar junction transistor (BJT) or heterojunction bipolar transistor (HBT), can be formed that incorporates these layers as extrinsic base layers. In the case of a bipolar device, the monocrystalline extrinsic base layers provide reduced base resistance $R_b$ and the isolation regions below provide reduced collector-to-base capacitance $C_{cb}$.

What is claimed is:

1. A method comprising:
    forming a pair of first openings extending vertically through a sacrificial layer, a dielectric layer, and a first semiconductor layer and into a semiconductor substrate;
    performing an etch process that laterally expands and merges said first openings within said semiconductor substrate only so as to create a trench;
    depositing dielectric material on said sacrificial layer to fill upper portions of said first openings above said trench, thereby creating a trench isolation region;
    removing said sacrificial layer;
    forming a second semiconductor layer on said dielectric layer, said second semiconductor layer being any one of amorphous and polycrystalline;
    forming a second opening extending vertically through said second semiconductor layer and said dielectric layer to expose a monocrystalline portion of said first semiconductor layer between said first openings; and
    epitaxially depositing a third semiconductor layer on said second semiconductor layer and in said second opening such that said third semiconductor layer has polycrystalline section on said second semiconductor layer and a monocrystalline section on said monocrystalline portion of said first semiconductor layer in said second opening.

2. The method of claim 1, after said epitaxially depositing of said third semiconductor layer, performing an anneal to crystallize regions of both said second semiconductor layer and said polycrystalline section of said third semiconductor layer adjacent to said monocrystalline section of said third semiconductor layer.

3. The method of claim 1, said depositing of said dielectric material being performed so that an air gap is created within said trench as said upper portions of said first openings are filled.

4. The method of claim 1, said etch process comprising a crystallographic etch process.

5. The method of claim 1, said forming of said second opening comprising:
    lithographically patterning and etching said second opening to expose said dielectric layer; and
    performing a pre-cleaning process to expose said monocrystalline portion of said first semiconductor layer between said first openings.

6. A method of forming a bipolar device, said method comprising:
    forming at least two pairs of first openings extending vertically through a sacrificial layer, a dielectric layer and an intrinsic base layer into a semiconductor substrate such that one pair of said first openings is on one side of a collector region in said semiconductor substrate and another pair of said first openings is on an opposite side of said collector region;
    performing an etch process that laterally expands and merges said first openings of each of said pairs within said semiconductor substrate only so as to create trenches on opposing sides of said collector region;

depositing dielectric material on said sacrificial layer to fill upper portions of said first openings above said trenches to create trench isolation regions;

removing said sacrificial layer;

forming a first extrinsic base layer on said dielectric layer, said first extrinsic base layer being any one of amorphous and polycrystalline;

forming second openings extending vertically through said first extrinsic base layer and said dielectric layer so as to expose monocrystalline portions of said intrinsic base layer between said first openings of each of said pairs;

epitaxially depositing a second extrinsic base layer on said first extrinsic base layer and on said monocrystalline portions of said intrinsic base layer in said second openings such that said second extrinsic base layer has a polycrystalline section on said first extrinsic base layer and monocrystalline sections on said monocrystalline portions of said intrinsic base layer in said second openings.

7. The method of claim 6, further comprising, after said epitaxially depositing of said second extrinsic base layer, performing an anneal to crystallize regions of both said first extrinsic base layer and said polycrystalline section of said second extrinsic base layer adjacent to said monocrystalline of said second extrinsic base layer.

8. The method of claim 6, further comprising:

etching a third opening through said second extrinsic base layer and said first extrinsic base layer to said dielectric layer, said third opening be aligned above said collector region;

extending said third opening through said dielectric layer to said intrinsic base layer using a wet etch process such that a lower portion of said third opening undercuts said first extrinsic base layer; and performing a selective epitaxial deposition process to form an additional semiconductor layer in said third opening, said additional semiconductor layer filling said lower portion of said third opening such that an edge portion of said additional semiconductor layer is stacked vertically between a top surface of said intrinsic base layer and a bottom surface of said first extrinsic base layer, said additional semiconductor layer further having a vertical extension positioned laterally adjacent to aligned vertical sidewalls of said first extrinsic base layer and said second extrinsic base layer above said lower portion of said third opening.

9. The method of claim 8, said edge portion and said vertical extension of said additional semiconductor layer creating an entirely monocrystalline link-up region between said intrinsic base layer and said first extrinsic base layer and said second extrinsic base layer.

10. The method of claim 8, further comprising forming an emitter layer in said third opening on said additional semiconductor layer.

11. The method of claim 6, said depositing of said dielectric material being performed so that an air gap is created within each of said trenches as said upper portions of said first openings of each of said pairs are filled.

12. The method of claim 6, said etch process comprising a crystallographic etch process.

13. The method of claim 6, said forming of said second openings comprising:

lithographically patterning and etching each of said second openings so as to initially expose said dielectric layer; and performing a pre-cleaning process to expose said monocrystalline portions of said intrinsic base layer between said first openings of each of said pairs.

* * * * *